(12) United States Patent
Wang et al.

(10) Patent No.: US 9,110,139 B2
(45) Date of Patent: *Aug. 18, 2015

(54) METHOD AND APPARATUS FOR BROADCASTING SCAN PATTERNS IN A SCAN-BASED INTEGRATED CIRCUIT

(71) Applicant: Syntest Technologies, Inc., Sunnyvale, CA (US)

(72) Inventors: Laung-Terng Wang, Sunnyvale, CA (US); Hsin-Po Wang, Hsinchu (TW)

(73) Assignee: Syntest Technologies, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/169,404

(22) Filed: Jan. 31, 2014

(65) Prior Publication Data

US 2014/0149816 A1    May 29, 2014

Related U.S. Application Data

(63) Continuation of application No. 13/527,137, filed on Jun. 19, 2012, now Pat. No. 8,667,451, which is a continuation of application No. 12/216,639, filed on Jul. 9, 2008, which is a continuation of application No. 11/104,651, filed on Apr. 13, 2005, now Pat. No. 7,412,672, which is a continuation-in-part of application No. 10/339,667, filed on Jan. 10, 2003, now Pat. No. 7,552,373.

(60) Provisional application No. 60/348,383, filed on Jan. 16, 2002.

(51) Int. Cl.
| | | |
|---|---|---|
| *G06F 17/50* | (2006.01) | |
| *G01R 31/3177* | (2006.01) | |
| *G01R 31/319* | (2006.01) | |
| *G01R 31/3185* | (2006.01) | |

(52) U.S. Cl.
CPC ...... *G01R 31/3177* (2013.01); *G01R 31/31926* (2013.01); *G01R 31/318533* (2013.01)

(58) Field of Classification Search
CPC .................. G01R 31/31704; G01R 31/318314; G01R 31/318364; G01R 31/318583; G01R 31/318594; G06F 17/5022; G06F 17/5045; G06F 2217/14
USPC .................................. 716/100–102, 136–139
See application file for complete search history.

(56) References Cited

U.S. PATENT DOCUMENTS

| | | | | |
|---|---|---|---|---|
| 5,812,561 | A * | 9/1998 | Giles et al. ..................... | 714/726 |
| 6,957,403 | B2 * | 10/2005 | Wang et al. ................... | 716/103 |
| 2003/0016042 | A1 * | 1/2003 | Parker ........................... | 324/765 |

OTHER PUBLICATIONS

"The Introduction to EDT (Testkompress) High Test Quality & Low Test Cost"; Mentor Graphics Slideshow; Dated 2001.

*Primary Examiner* — Binh Tat
(74) *Attorney, Agent, or Firm* — Bacon&Thomas,PLLC

(57) ABSTRACT

A broadcaster, system, and method for reducing test data volume and test application time in an ATE (automatic test equipment) in a scan-based integrated circuit. The scan-based integrated circuit contains multiple scan chains, each scan chain comprising multiple scan cells coupled in series. The broadcaster is a combinational logic network coupled to an optional virtual scan controller and an optional scan connector. The virtual scan controller controls the operation of the broadcaster. The system transmits virtual scan patterns stored in the ATE and generates broadcast scan patterns through the broadcaster for testing manufacturing faults in the scan-based integrated circuit. The number of scan chains that can be supported by the ATE is significantly increased. Methods are further proposed to reorder scan cells in selected scan chains, to generate the broadcast scan patterns and virtual scan patterns, and to synthesize the broadcaster and a compactor in the scan-based integrated circuit.

21 Claims, 25 Drawing Sheets

| Broadcast Scan Inputs | | | Input Constraints | | | | | | | | /531 |
|---|---|---|---|---|---|---|---|---|---|---|---|
| X2 | X1 | X0 | Y7 | Y6 | Y5 | Y4 | Y3 | Y2 | Y1 | Y0 | |
| 0 | 0 | 0 | 0 | 1 | 0 | 0 | 0 | 1 | 1 | 0 | |
| 0 | 0 | 1 | 0 | 1 | 1 | 0 | 1 | 0 | 0 | 1 | |
| 0 | 1 | 0 | 0 | 1 | 0 | 1 | 0 | 0 | 1 | 0 | |
| 0 | 1 | 1 | 0 | 1 | 1 | 1 | 1 | 0 | 0 | 1 | |
| 1 | 0 | 0 | 1 | 0 | 1 | 1 | 0 | 0 | 1 | 0 | |
| 1 | 0 | 1 | 1 | 0 | 0 | 1 | 0 | 0 | 0 | 1 | |
| 1 | 1 | 0 | 1 | 0 | 1 | 1 | 1 | 0 | 1 | 0 | |
| 1 | 1 | 1 | 1 | 0 | 0 | 1 | 1 | 0 | 0 | 1 | |

FIG. 5B

| Broadcast Scan Inputs | | | Input Constraints | | | | |
|---|---|---|---|---|---|---|---|
| X2 | X1 | X0 | Y4 | Y3 | Y2 | Y1 | Y0 |
| 0 | 0 | 0 | 0 | 0 | 0 | 0 | 1 |
| 0 | 0 | 1 | 0 | 1 | 0 | 0 | 0 |
| 0 | 1 | 0 | 0 | 0 | 1 | 1 | 1 |
| 0 | 1 | 1 | 0 | 1 | 1 | 1 | 0 |
| 1 | 0 | 0 | 1 | 1 | 1 | 0 | 1 |
| 1 | 0 | 1 | 1 | 0 | 1 | 0 | 0 |
| 1 | 1 | 0 | 1 | 1 | 1 | 1 | 1 |
| 1 | 1 | 1 | 1 | 0 | 1 | 1 | 0 |

FIG. 5D

METHOD AND APPARATUS FOR BROADCASTING SCAN PATTERNS IN A SCAN-BASED INTEGRATED CIRCUIT

RELATED APPLICATION DATA

This application is a continuation of nonprovisional U.S. patent application Ser. No. 13/527,137, filed Jun. 19, 2012, which is a continuation of nonprovisional U.S. patent application Ser. No. 12/216,639, filed Jul. 9, 2008, which is a continuation of nonprovisional U.S. patent application Ser. No. 11/104,651, filed Apr. 13, 2005, which is a continuation-in-part of nonprovisional U.S. patent application Ser. No. 10/339,667, filed Jan. 10, 2003, which claims the benefit of U.S. Provisional Application Ser. No. 60/348,383, filed Jan. 16, 2002, each listed priority application being hereby incorporated by reference.

TECHNICAL FIELD

The present invention generally relates to the field of logic design and test using design-for-test (DFT) techniques. Specifically, the present invention relates to the field of logic test and diagnosis for integrated circuits using scan or built-in self-test (BIST) techniques.

BACKGROUND

As the complexity of integrated circuits increases, it becomes more and more important to achieve very high fault coverage while minimizing test cost. Although traditional scan-based methods have been quite successful in meeting these goals for sub-million gate designs during the past few decades, for recent scan-based designs larger than one-million gates, achieving this very high fault coverage at a reasonable price has become quite difficult. This is mainly due to the fact that it requires a significant amount of test-data storage volume to store scan patterns onto the automatic test equipment (ATE). In addition, this increase in test-data storage volume has resulted in a corresponding increase in the costs related to test-application time. Conventional approaches for solving this problem focus on either adding more memory onto the ATE or truncating part of the scan data patterns. These approaches fail to adequately solve the problem, since The former approach adds additional test cost so as not to compromise the circuit's fault coverage, while the latter sacrifices the circuit's fault coverage to save test cost.

As an attempt to solve this problem, a number of prior art design-for-test (DFT) techniques have been proposed. These solutions focus on increasing the number of internal scan chains, in order to reduce test-data volume and hence test application time without increasing, and in some cases while decreasing or eliminating the number of scan-chains that are externally accessible. This removes package limitations on the number of internal scan chains that in some cases can even exceed the package pin count.

An example of such a DFT technique is Built-In Self-Test (BIST). See U.S. Pat. No. 4,503,537 issued to McAnney (1985). BIST implements on-chip generation and application of pseudorandom scan patterns to the circuit under test eliminating all external access to the scan-chains, and hence removing any limitation on the number of internal scan-chains that can be used. BIST, however, does not guarantee very high fault coverage and must often be used together with scan ATPG (automatic test pattern generation) to cover any remaining hard-to-detect faults.

Several different approaches for compressing test data before transmitting them to a circuit under test have been proposed. See the papers co-authored by Koenemann et al. (1991), Hellebrand et al. (1995), Rajski et al. (1998), Jas et al. (2000), Bayraktaroglu et al. (2001), and U.S. Pat. No. 6,327,687 issued to Rajski et al. (2001). These methods are based on the observation that test cubes (i.e., arrangements of scan data patterns stored within the scan chains of a circuit under test) often contain a large number of unspecified (don't care) positions. It is possible to encode such test cubes with a smaller number of bits and later decompress them on-chip using an LFSR (linear-feedback shift register) based decompression scheme. This scheme requires solving a set of linear equations every time a test cube is generated using scan ATPG. Since solving these linear equations depends on the number of unspecified bits within a test cube, these LFSR-based decompression schemes often have trouble compressing an ATPG pattern without having to break it up into several individual patterns before compression, and hence have trouble guaranteeing very high fault coverage without having to add too many additional scan patterns.

A different DFT technique to reduce test data volume is based on broadcast scan. See the papers co-authored by Lee (1999) et al., Hamzaoglu et al. (1999), and Pandey et al. (2002). Broadcast scan schemes either directly connect multiple scan chains, called broadcast channels, to a single scan input or divide scan chains into different partitions and shift the same pattern into each partition through a single scan input. In these schemes, the connections between each and every scan input and its respective broadcast channels is done using either wires or buffers, without any logic gates, such as AND, OR, NAND, NOR, XOR, XNOR, MUX (multiplexer), or NOT (inverter) in between. Although it is possible to implement this scheme with practically no additional hardware overhead, it results in scan chains with very large correlation between different scan-chain data bits, resulting in input constraints that are too strong to achieve very high fault coverage.

Accordingly, there is a need to develop an improved method and apparatus for guaranteeing very high fault coverage while minimizing test data volume and test application time. The method we propose in this invention is based on broadcast scan, and thus, there is no need to solve any linear equations as a separate step after scan ATPG. A broadcast scan reordering approach is also proposed to further improve the circuit's fault coverage.

SUMMARY

Accordingly, a primary objective of this invention is to provide such an improved method and apparatus. The method we propose is based on broadcast scan, but adds a broadcaster circuit placed between the ATE (automatic test equipment) outputs and the scan chain inputs of the circuit under test. This broadcaster can be embedded on-chip or designed into the ATE. For the sake of simplicity, in this discussion we assume that the broadcaster is placed between the ATE and the integrated circuit under test without specifying where it is located physically. The following discussion applies regardless of where the broadcaster is embedded in an actual implementation.

The method according to the present invention is used to generate a broadcast scan patterns that are applied to the scan cells (memory elements) of an integrated circuit design under test. This process involves converting the virtual scan patterns stored in an ATE into broadcast scan patterns that are applied to the package scan input pins of the integrated circuit using a broadcaster. This broadcaster maps the virtual scan patterns into their corresponding broadcast scan patterns that are used to test for various faults, such as stuck-at faults, delay faults, and bridging faults in an integrated circuit. The integrated circuits tested contains multiple scan chains each consisting of any number of scan cells coupled together that store the broadcast scan pattern.

One important aspect of this invention is the design of the broadcaster circuitry. The broadcaster can be as simple as a network of combinational logic circuitry (combinational logic network) or can possibly comprise a virtual scan controller in addition to a network of combinational logic. (Please refer to FIG. 4 and FIG. 6 in DETAILED DESCRIPTION OF THE DRAWINGS for more descriptions). Adding a virtual scan controller allows the mapping performed by the broadcaster to vary depending on the internal state of the controller. The broadcaster can also be implemented using a programmable logic array. In this scheme, each ATE output is connected to a subset of the scan chain (or scan partition) inputs via the combinational logic network. Any remaining inputs of the combinational logic network are directly connected to the virtual scan controller outputs if available. During scan test, the virtual scan controller is first loaded with a predetermined value using boundary-scan or other external means. This is used to initially setup the function of the broadcaster. Later in the test, It is possible and often desirable to load in a different predetermined value into the virtual scan controller in order to change the function of the broadcaster, and this can be repeated any number of times. This allows the outputs of the broadcaster to implement different or all combinations of logic functions. Since the function of the broadcaster is a programmable function of the value stored in the virtual scan controller, there is no limitation to the number of mappings that can be implemented. This relaxes the strong input constraints of traditional broadcast scan and increases the ability to generate broadcast scan patterns to test more and possibly all testable faults. This is true since the value stored in the virtual scan controller determines the input constraints imposed on the generation of broadcast scan patterns.

While a combinational logic network is the preferred implementation for the broadcaster due to its simplicity and low overhead, the broadcaster described in this invention can comprise a virtual scan controller and any combinational logic network. The virtual scan controller can be any general finite state machine, such as an LFSR (linear feedback shift register), as long as predetermined values can be loaded into all memory elements of the finite-state machine, such as D flip-flops or D latches, when desired. The combinational logic network can includes one or more logic gates, such as AND, OR, NAND, NOR, XOR, MUX, NOT gates, or any combination of the above. This combinational logic network increases the chance of generating broadcast scan patterns that test additional faults, such as pattern resistant faults when compared to traditional broadcast scan.

Another aspect of this invention is the creation and generation of broadcast scan patterns that meets the input constraints imposed by the broadcaster. When a combinational logic network is used to implement the broadcaster, the input constraints imposed by the broadcaster allow only a subset of the scan cells to receive a predetermined logic value either equal or complementary to the ATE output, at any time. Unlike the prior-art broadcast scan schemes which only allow all-zero and all-one patterns to be applied to the broadcast channels, the present invention allows different combinations of logic values to appear at these channels at different times. The only thing needed to generate these test patterns is to enhance the currently available ATPG tools to implement these additional input constraints. Hence, the process of generating broadcast scan patterns will be to generate patterns using an initial set of input constraints and to analyze the coverage achieved. If the fault coverage achieved is unsatisfactory, a different set of input constraints is applied and a new set of vectors are generated. This process is repeated until predetermined limiting criteria are met.

In order to reduce the number of input constraints needed to achieve very high fault coverage, the present invention may involve a broadcast scan chain reordering step before ATPG takes place. Our approach is to perform input-cone analysis from each cone output (scan cell input) tracing backwards to all cone inputs (scan cell outputs), and then to uses a maximal covering approach to reorder all cone inputs (scan cell outputs) so that only one constrained scan cell is located on a single broadcast channel during any shift clock cycle. These broadcast scan order constraints reduce, if not eliminate, the data dependency among broadcast channels associated with one ATE output. This gives the ATPG tool a better chance of generating broadcast scan patterns that achieve the target fault coverage without having to use a different set of input constraints. Please note that this applies only to integrated circuits that are still in the development phase, and hence broadcast scan reordering should be performed before the chip tapes out.

Although this process does add some CPU time to the ATPG process, it is much simpler and less computationally intensive as having to solve sets of linear equations after ATPG. The one-step "broadcast ATPG" process makes it easier to generate broadcast scan patterns as compared to LFSR-based decompression schemes. In addition, it is possible to use maximum dynamic compaction, an essential part of combinational ATPG, to fill in as many as unspecified (don't-care) positions in an effort to detect the most possible faults using a single scan pattern. This is in sharp contrast to LFSR-based decompression schemes where unspecified (don't-care) positions are desirable in order to be able to solve the linear equations needed to obtain a compressed test pattern. This is the fundamental conflict and flaw in LFSR-based decompression schemes that require starting out with a set of ATPG vectors with little compaction in order to be able to generate a set of more compact vectors. This reduces the actual compaction achieved when compared to an initial set of compact ATPG vectors testing the same faults, and allows the virtual-scan controller-based broadcast-scan method described in the present invention to cover more faults per scan test pattern than any LSFR-based decompression scheme.

THE BRIEF DESCRIPTION OF DRAWINGS

The above and other objects, advantages and features of the invention will become more apparent when considered with the following specification and accompanying drawings wherein:

FIG. 5B shows the inputs constraint imposed by the embodiment of a broadcaster shown in FIG. 5A;

FIG. 5D shows the inputs constraint imposed by the embodiment of a broadcaster shown in FIG. 5C;

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
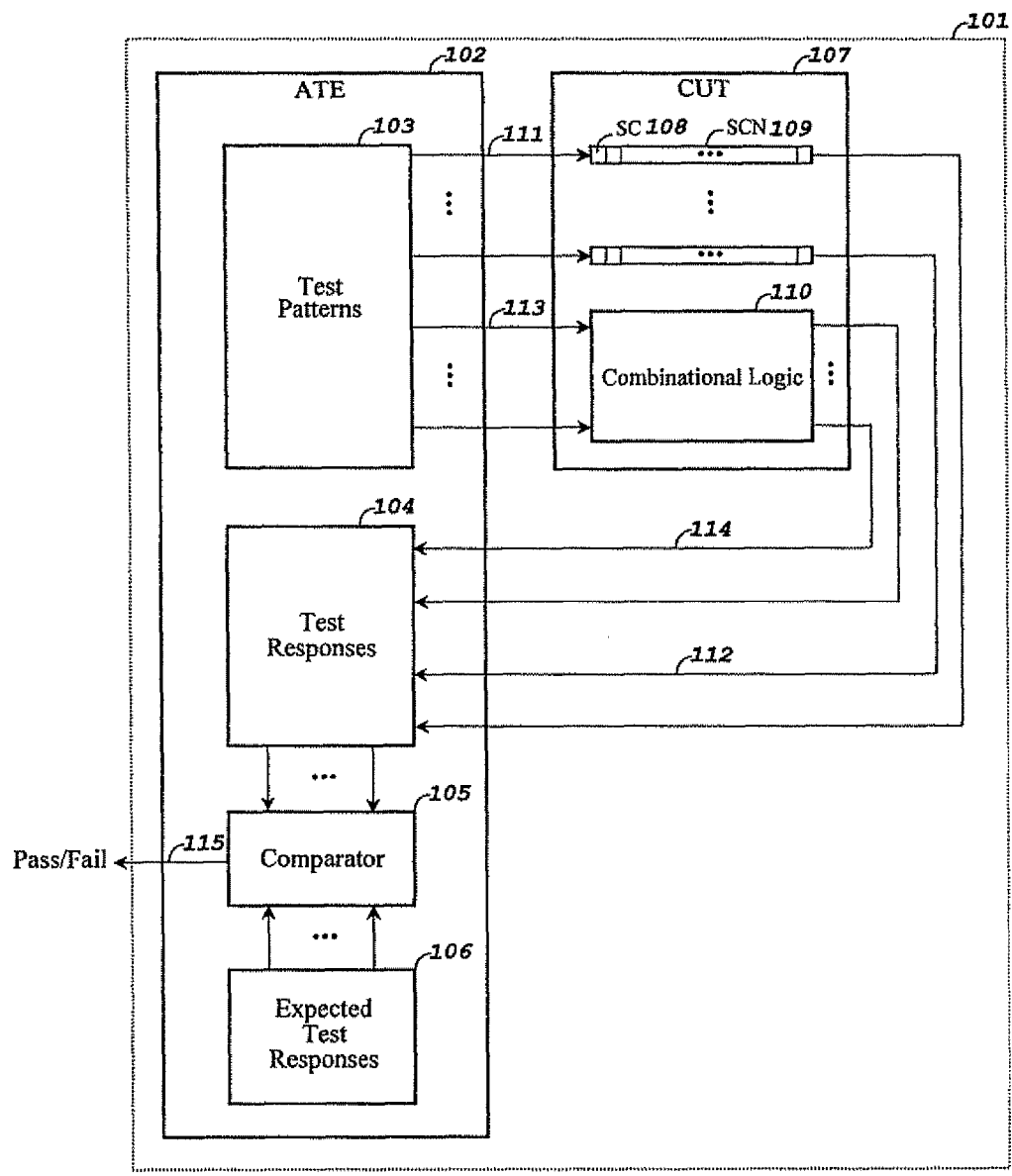
FIG. 1 shows a block diagram of a conventional system for testing scan-based integrated circuits using an automatic test equipment (ATE)

FIG. 1 shows a block diagram of a conventional system for testing scan-based integrated circuits using an ATE. The system 101 includes a tester or external automatic test equipment (ATE) 102 and a circuit-under-test (CUT) 107, which contains scan chains 109.

The ATE 102 applies a set of fully specified test patterns 103, one by one, to the CUT 107 via scan chains 109 in scan mode from external scan input pins 111 as well as from external primary input pins 113. The CUT is then run in normal mode using the applied test pattern as input, and the response to the test pattern is captured into the scan chains. The CUT is then put back into scan mode again and the test response is shifted out to the ATE via scan chains from external scan output pins 112 as well as from external primary output pins 114. The shifted-out test response 104 is then compared by the comparator 105 with the corresponding expected test response 106 to determine if any fault exists in the CUT, and indicates the result by the pass/fail signal 115.

In the conventional system 101, the number of scan chains 109 in the CUT 107 is identical to the number of the external scan input pins 111 or the number of the external scan output pins 112. Since the number of external pins is limited in an integrated circuit, the number of scan chains in the conventional system is also limited. As a result, a large integrated circuit with a large number of scan cells (SC) 108 usually contains very long scan chains for scan test. This will result in unacceptably large test data volume and costly long test application time.

Figure 2:
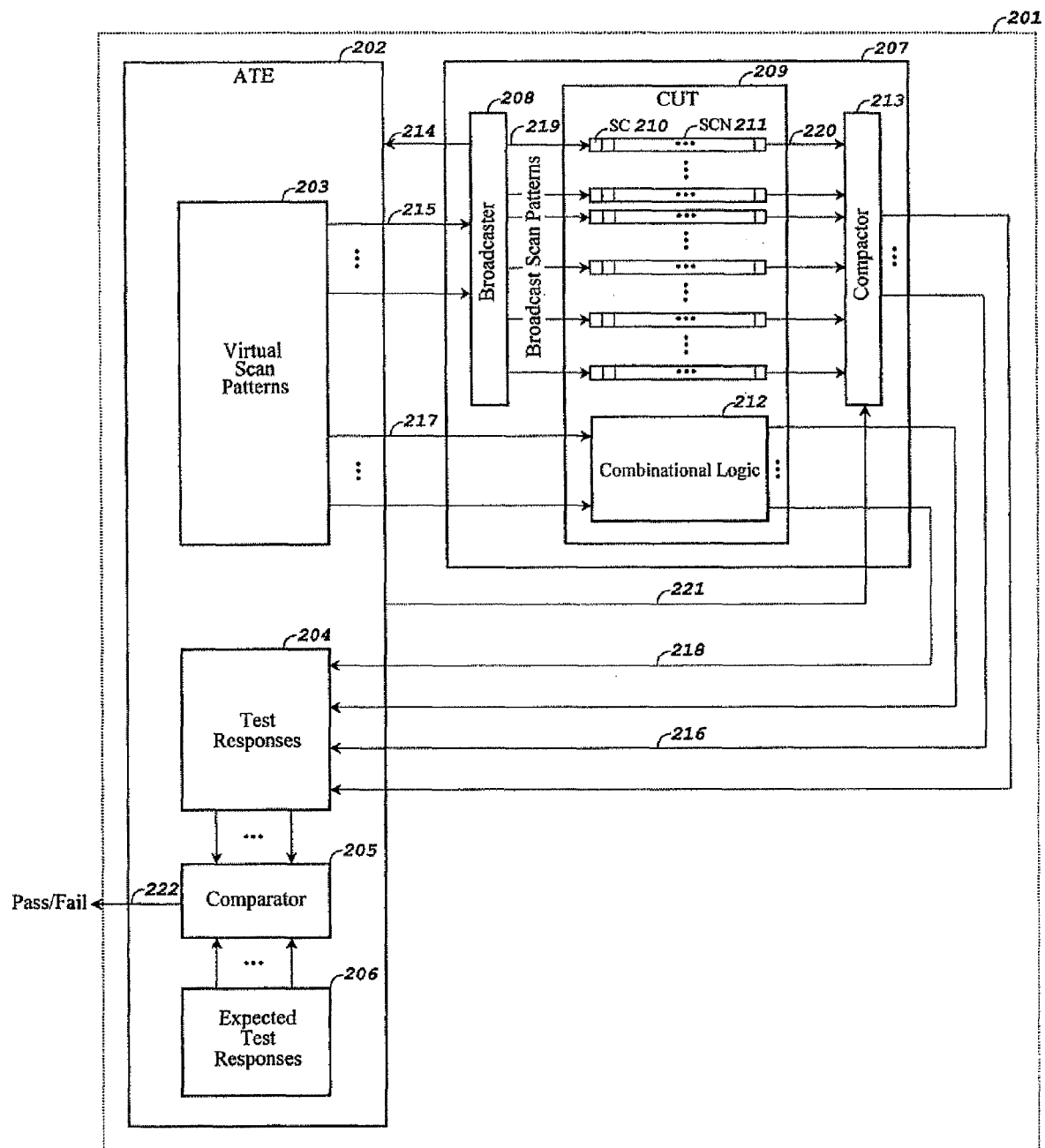
FIG. 2 shows a block diagram of a broadcast scan test system, in accordance with the present invention, for testing scan-based integrated circuits using an ATE.

FIG. 2 shows a block diagram of a broadcast scan test system, in accordance with the present invention, for testing scan-based integrated circuits using an ATE. The system 201 includes an ATE 202 and a circuit 207 that includes a broadcaster 208, a CUT 209, and a compactor 213. The CUT contains scan chains 211.

Figure 4:
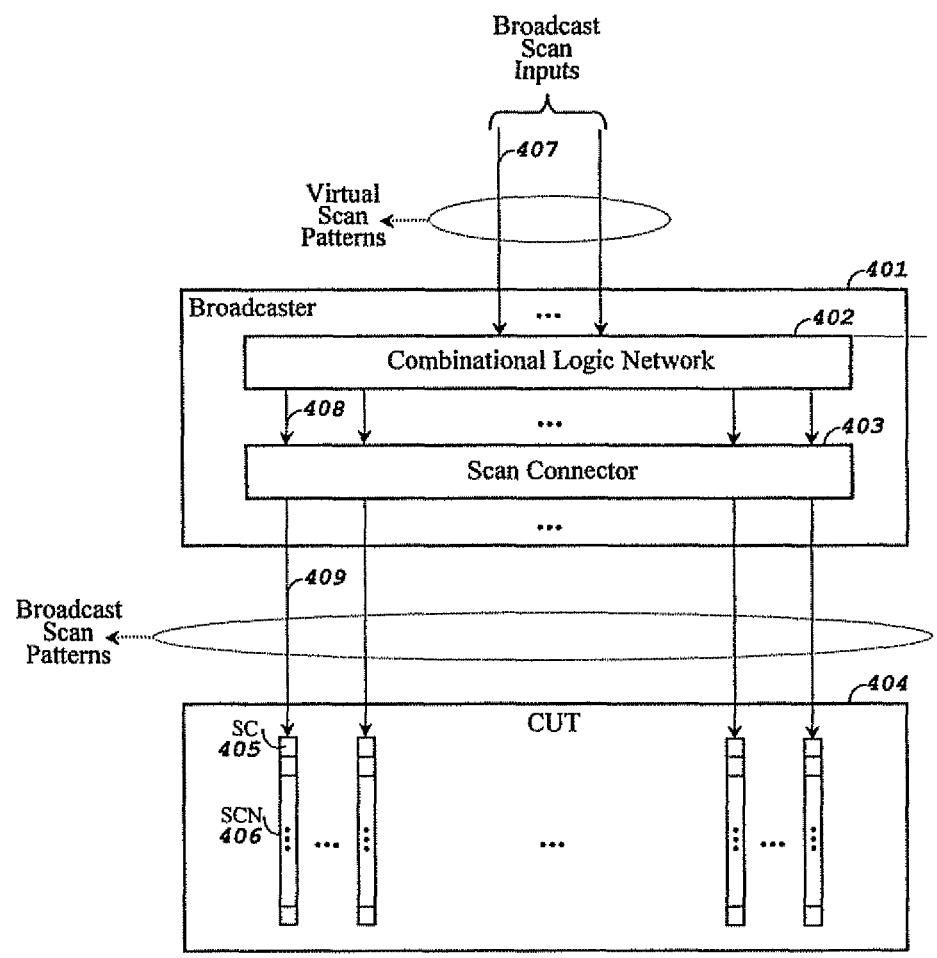
FIG. 4 shows a block diagram of a broadcaster, in accordance with the present invention, consisting of a combinational logic network and an optional scan connector.
Figure 6:
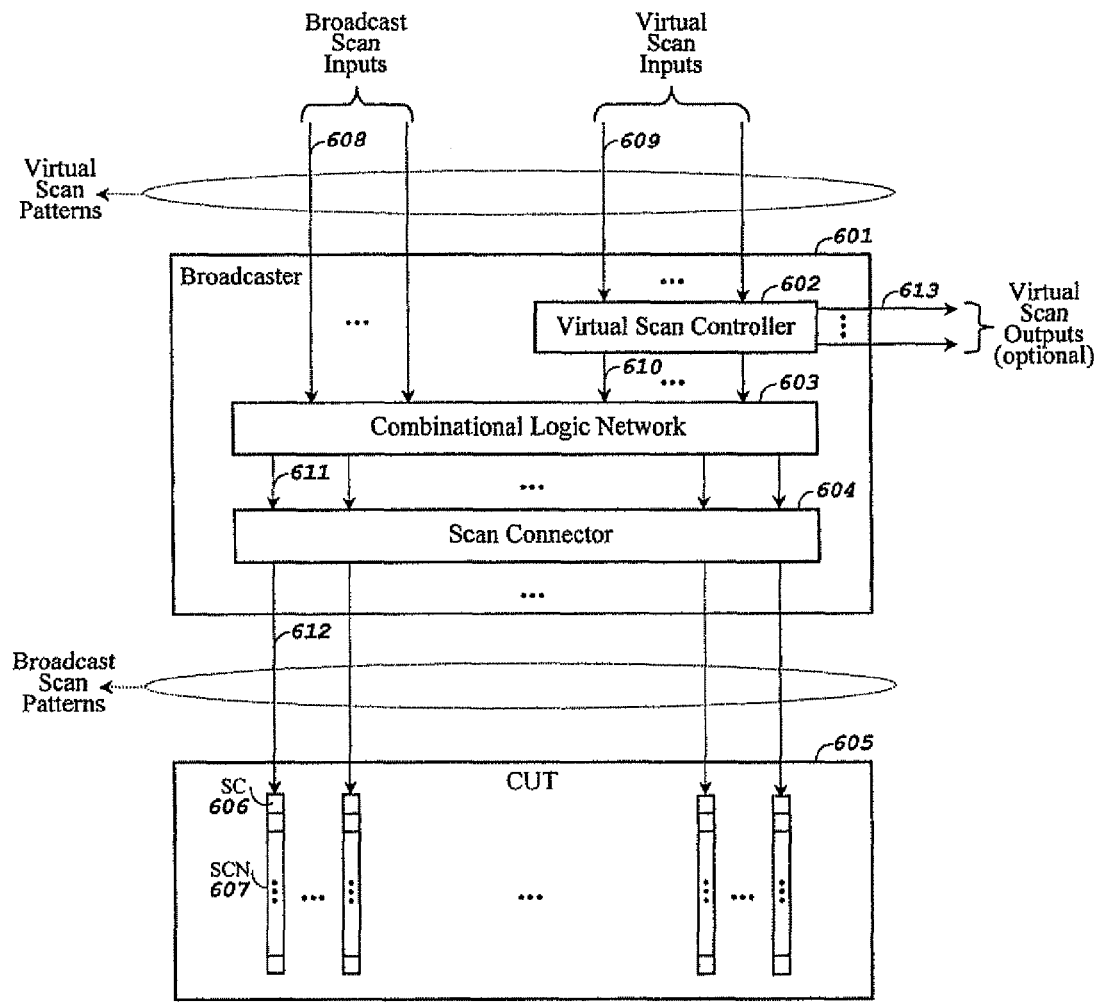
FIG. 6 shows a block diagram of a broadcaster, in accordance with the present invention, consisting of a virtual scan controller, a combinational logic network, and an optional scan connector.

The broadcaster 208 may contain only a combinational logic network as shown in FIG. 4 or a virtual scan controller in addition to a combinational logic network as shown in FIG. 6. The broadcaster is used to map virtual scan patterns 203 to broadcast scan patterns, where the number of bits of a virtual scan pattern is usually smaller than that of a broadcast scan pattern. The mapping function of a broadcaster is fixed if it only contains a combinational logic network. However, the mapping function is variable if it also contains a virtual scan controller. In this case, the output values of the virtual scan controller can change the mapping function that the combinational logic network realizes, thus implementing different mapping relations from external scan input pins 215 to internal scan chain inputs 219. The compactor 213 is a combinational logic network, such as an XOR network, designed to map the internal scan chain outputs 220 to external scan output pins 216. Note that in practice, the number of external scan input or output pins is smaller than the number of internal scan chain inputs or outputs.

Note that the element 213 can be replaced with an optional space compactor and a multiple-input signature registers (MISR). In this case, all test responses will be compressed into a single signature, which can be compared with a reference signature either in the circuit 207 or in the ATE 202 after all broadcast scan patterns have been applied.

In addition, the compactor 213 usually contains a mask network used to block several output streams from coming into a XOR compaction network or a MISR. This is useful in fault diagnosis.

Figure 3:
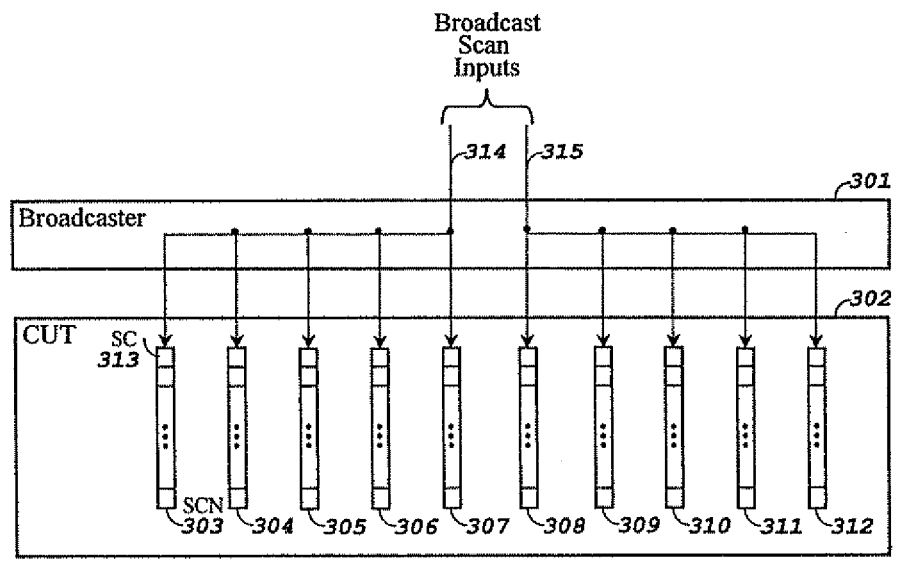
FIG. 3 shows a prior art broadcaster design with only pure wires.

FIG. 3 shows a prior art broadcaster design with only pure wires. This example broadcaster design 301 has two broadcast scan inputs 314 and 315. The broadcast scan input 314 is connected directly to scan chains 303 to 307 while the broadcast scan input 315 is connected directly to scan chains 308 to 312. Although the overhead of this pure-wire broadcast design is very low, the test pattern dependency among the scan chains fed by the same broadcast scan input is very high. From the point of view of automatic test pattern generation (ATPG), this pure-wire broadcast design puts a strong constraint on the inputs to scan chains. As a result, this scheme usually suffers from severe fault coverage loss.

FIG. 4 shows a block diagram of a broadcaster, in accordance with the present invention, consisting of a combinational logic network and an optional scan connector. Virtual scan patterns are applied via broadcast scan inputs 407 of the broadcaster 401 to the combinational logic network 402. The combinational logic network implements a fixed mapping function, which converts a virtual scan pattern into a broadcast scan pattern. The broadcast scan pattern is then applied to all scan chains 409 in the CUT 404, through an optional scan connector 403.

The broadcaster 401 serves the purpose of providing test patterns to a large number of internal scan chains 406 through a small number of external broadcast scan input pins 407. As a result, all scan cells SC 405 in the CUT 404 can be configured into a large number of shorter scan chains. This will help in reducing test data column and test application time. By properly designing the combinational logic network 402, one can reduce the fault coverage loss caused by additional constraints imposed on the input pins of the scan chains.

Figure 5A:
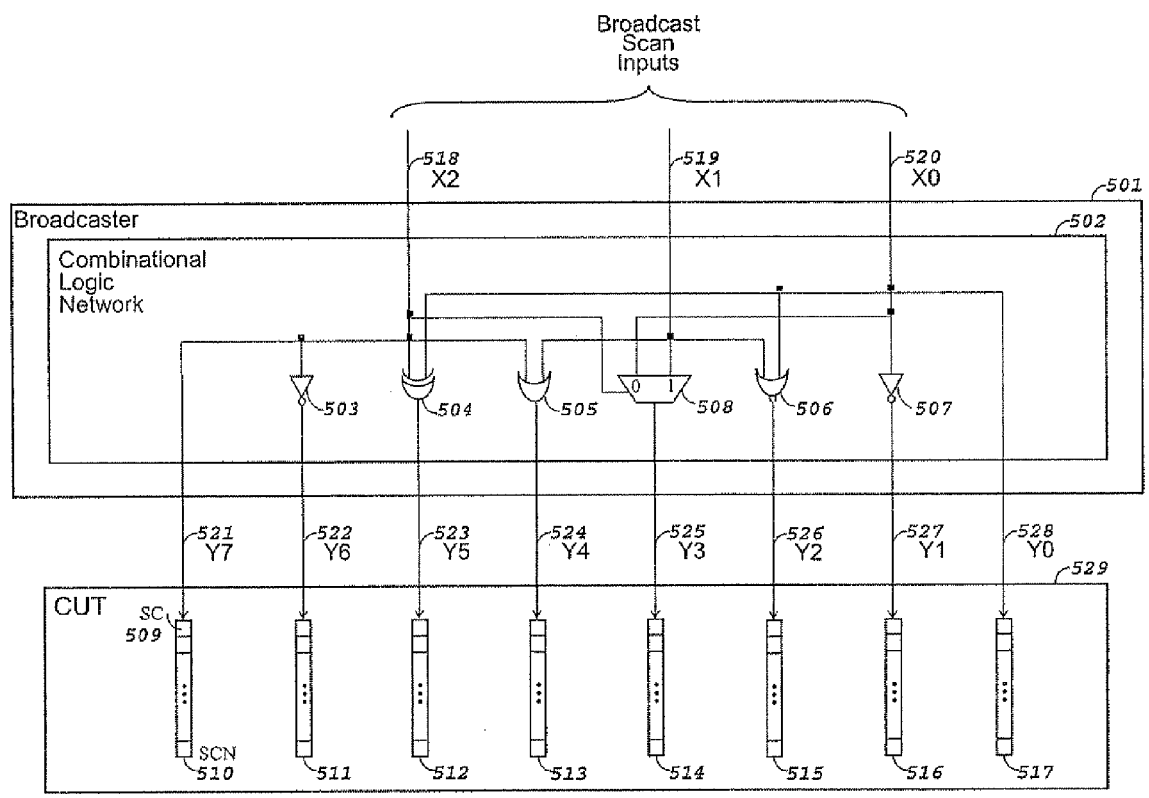
FIG. 5A shows a first embodiment of a broadcaster shown in FIG. 4, in accordance with the present invention, consisting of a combinational logic network.

FIG. 5A shows a first embodiment of a broadcaster shown in FIG. 4, in accordance with the present invention, consisting of a combinational logic network. In this example, a 3-bit virtual scan pattern is converted into an 8-bit broadcast scan pattern via the broadcaster 501.

The broadcaster 501 consists of a combinational logic network 502, which contains two inverters 503 and 507, one multiplexer 508, one XOR gate 504, one OR gate 505, and one NOR gate 506. Virtual scan patterns are applied via broadcast scan inputs X2 518 to X0 520. The combinational logic network implements a fixed mapping function, which converts a virtual scan pattern into a broadcast scan pattern. The broadcast scan pattern is then applied to all scan chains 510 to 517 via Y7 521 to Y0 528 in the CUT 529.

FIG. 5B shows the inputs constraint imposed by the embodiment of a broadcaster shown in FIG. 5A.

The broadcaster 501 in FIG. 5A has three broadcast scan inputs X2 518 to X0 520. Thus, there are 8 input combinations for the broadcast scan inputs as listed under <X2, X1, X0> in the table 531. These are all possible input value combinations to the combinational logic network 502 in FIG. 5A. Therefore, as the outputs of the combinational logic network, there are 8 value combinations as listed under <Y7, Y6, Y5, Y4, Y3, Y2, Y1, Y0> in the table 531. These are all possible logic value combinations that may appear at the inputs of the scan chains 510 to 517 in FIG. 5A, and they are the input constraints in the process of ATPG.

Figure 5C:
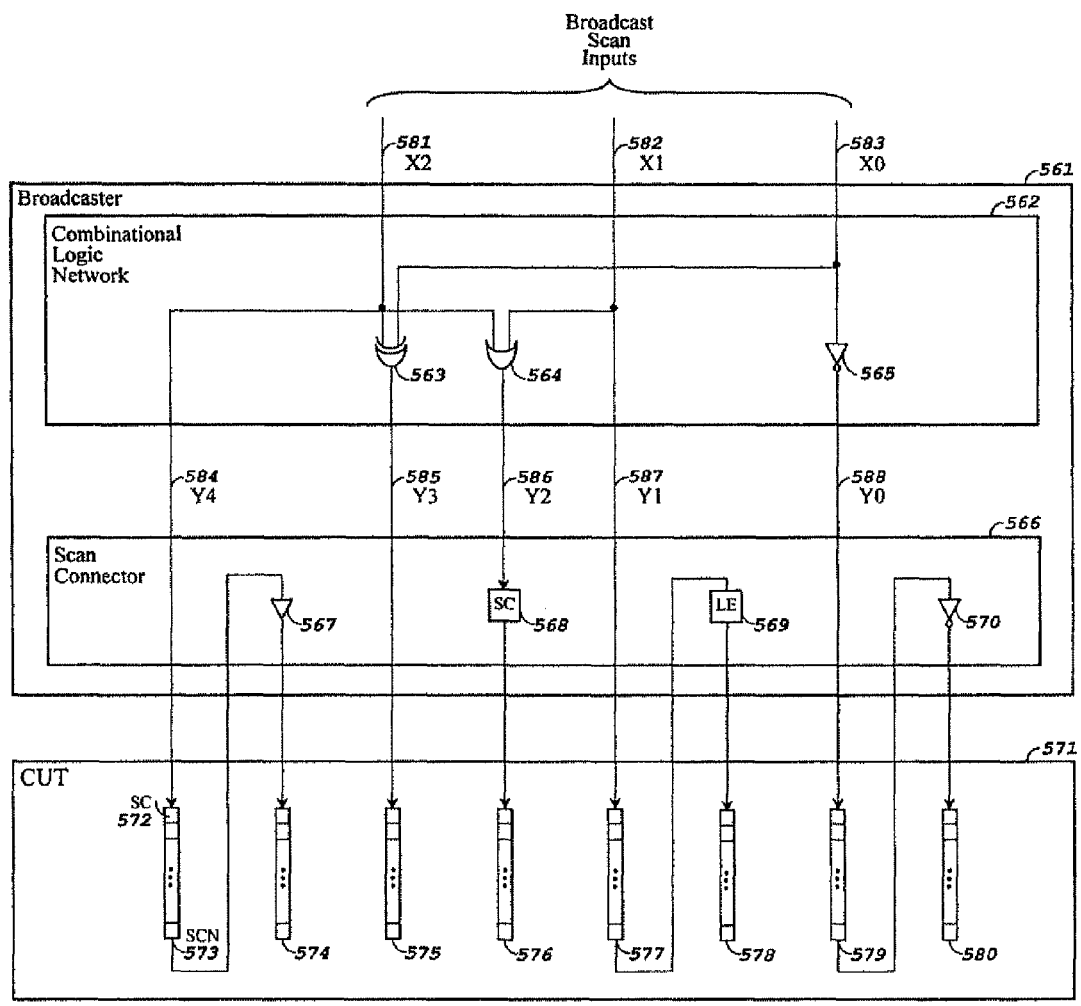
FIG. 5C shows a second embodiment of a broadcaster shown in FIG. 4, in accordance with the present invention, consisting of a combinational logic network and a scan connector.

FIG. 5C shows a second embodiment of a broadcaster shown in FIG. 4, in accordance with the present invention, consisting of a combinational logic network and a scan connector. In this example, a 3-bit virtual scan pattern is converted into an 8-bit broadcast scan pattern via the broadcaster 561.

The broadcaster 561 consists of a combinational logic network 562 and a scan connector 566. The combinational logic network contains one inverter 565, one XOR gate 563, and one OR gate 564. Virtual scan patterns are applied via broadcast scan inputs X2 581 to X0 583. The combinational logic network implements a fixed mapping function, which converts a virtual scan pattern into a broadcast scan pattern. The broadcast scan pattern is then applied to all scan chains 573 to 580 through the scan connector 566. The scan connector consists of one buffer 567, one inverter 570, one lock-up element LE 569, and one spare cell SC 568. Generally, two scan chains can be connected into one by using a buffer, an inverter, or a lock-up element in a scan connector. In addition, a spare cell can be added into an existing scan chain to change its length in order to reduce the dependency among different scan chains. This will help improve fault coverage.

FIG. 5D shows the inputs constraint imposed by the embodiment of a broadcaster shown in FIG. 5C.

The broadcaster 561 in FIG. 5C has three broadcast scan inputs X2 581 to X0 583. Thus, there are 8 input combinations for the broadcast scan inputs as listed under <X2, X1, X0> in the table 591. These are all possible input value combinations to the combinational logic network 562 in FIG. 5C. Therefore, as the outputs of the combinational logic network, there are 8 value combinations as listed under <Y4, Y3, Y2, Y1, Y0> in the table 591. These are the input constraints in the process of ATPG.

FIG. 6 shows a block diagram of a broadcaster, in accordance with the present invention, consisting of a virtual scan controller, a combinational logic network, and an optional scan connector.

The broadcaster 601 consists of a virtual scan controller 602, a combinational logic network 603, and an optional scan connector 604. Virtual scan patterns are applied via two types of input pins: broadcast scan inputs 608 and virtual scan inputs 609. The broadcast scan inputs are connected directly to the combinational logic network, while the virtual scan inputs are connected directly to the virtual scan controller. In addition, the virtual scan controller may have optional virtual scan outputs 613.

Note that the virtual scan controller 602 can be either a combinational circuit such as a decoder, or a sequential circuit such as a shift register. The logic values applied through virtual scan inputs 609 may or may not change in each clock cycle although logic values applied through broadcast scan inputs 608 change in each clock cycle. The purpose of applying virtual scan input values is to change and store a proper set-up value combination in the virtual scan controller. This set-up value combination is applied to the combinational logic network 603 through 610 in order to change the mapping function that the combinational logic network implements. Since one mapping function corresponds to one set of input constraints for ATPG, providing the capability of changing mapping functions results in more flexible input constraints for ATPG. As a result, fault coverage loss due to the broadcast scheme can be substantially reduced.

Generally, the broadcaster 601 serves two purposes during test. One purpose is to provide test patterns to a large number of internal scan chains 607 through a small number of external broadcast scan input pins 608 and virtual scan input pins 609. As a result, all scan cells SC 606 in a circuit can be configured into a large number of shorter scan chains. This will help in reducing test data volume and test application time. Another purpose is to increase the quality of broadcast scan patterns applied from the combinational logic network 603 to all scan chains in order to obtain higher fault coverage. This is achieved by changing the values loaded into the virtual scan controller. Because of this flexibility, the combinational logic network can realize different mapping functions rather than a fixed one.

Figure 7:
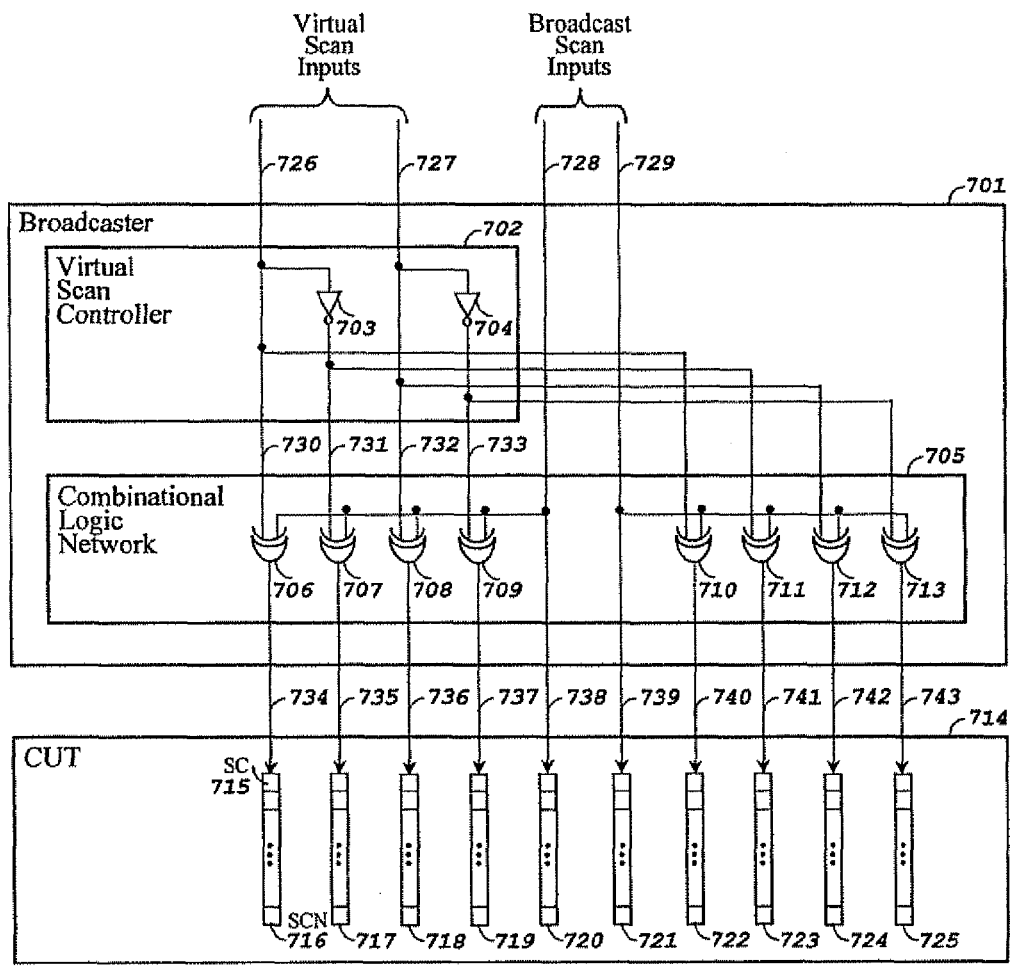
FIG. 7 shows a first embodiment of a broadcaster shown in FIG. 6, in accordance with the present invention.

FIG. 7 shows a first embodiment of a broadcaster shown in FIG. 6, in accordance with the present invention. The broadcaster 701 consists of a virtual scan controller 702 and a combinational logic network 705. The virtual scan controller consists of two inverters 703 and 704. The combinational logic network is composed of 8 XOR gates 706 to 713. In this example, a 4-bit virtual scan pattern is converted into an 8-bit broadcast scan pattern via the broadcaster.

Obviously, the outputs 730 and 731 of the virtual scan controller 702 must have complementary values. In addition, the outputs 732 and 733 of the virtual scan controller must also have complementary values. Suppose that the values applied to the two broadcast scan inputs 728 and 729 are V1 and V2, respectively. In this case, the values appearing at scan chain inputs 734 to 743 should be P1, ~P1, P2, ~P2, V1, V2, P3, ~P3, P4, ~P4, respectively. Here P1 and ~P1 are complementary, P2 and ~P2 are complementary, P3 and ~P3 are complementary, P4 and ~P4 are complementary. In addition, P1 and P2 are either the same as V1 or are the complement of V1 while P3 and P4 are either the same as V1 or are the complement of V2. This is the input constraint for ATPG.

Figure 8:
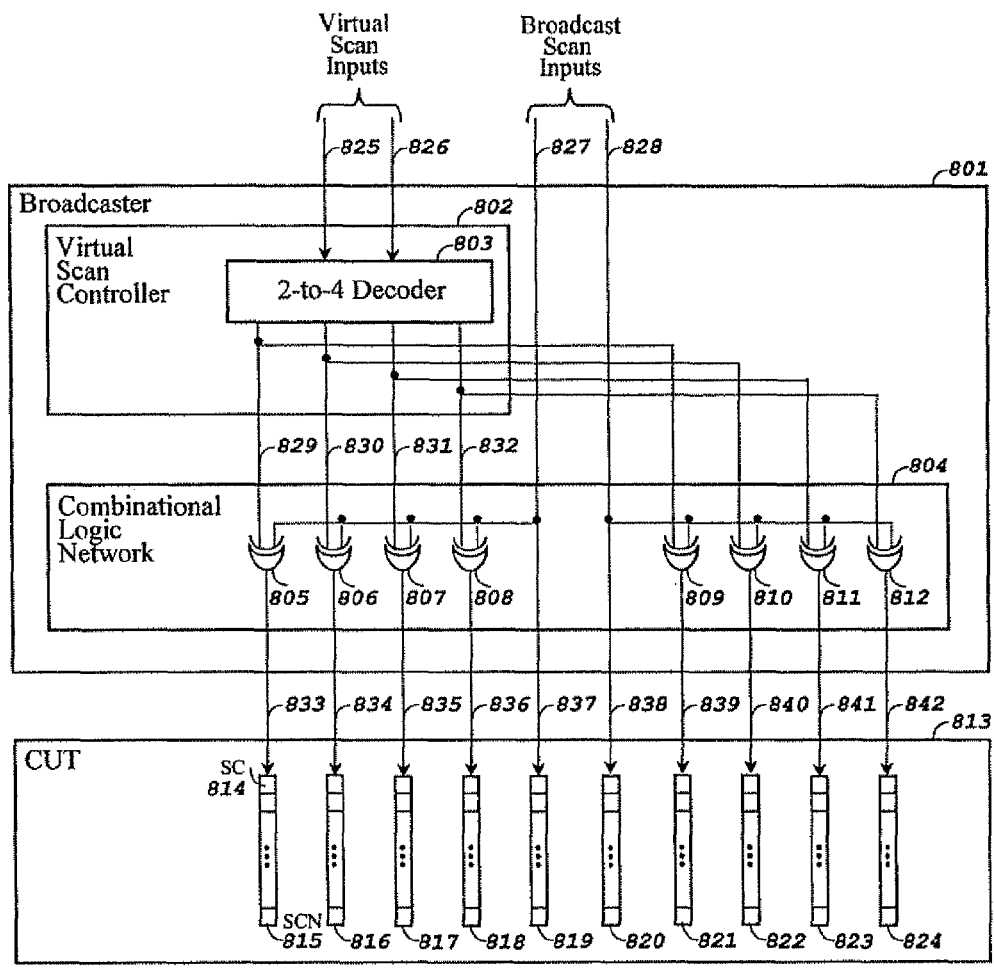
FIG. 8 shows a second embodiment of a broadcaster shown in FIG. 6, in accordance with the present invention.

FIG. 8 shows a second embodiment of a broadcaster shown in FIG. 6, in accordance with the present invention. The broadcaster 801 consists of a virtual scan controller 802 and a combinational logic network 804. The virtual scan controller consists of a 2-to-4 decoder 803. The combinational logic network is composed of 8 XOR gates 805 to 812. In this example, a 4-bit virtual scan pattern is converted into an 8-bit broadcast scan pattern via the broadcaster.

Obviously, there are four possible logic value combinations for the outputs 829 to 832 of the 2-to-4 decoder 803. They are 1000, 0100, 0010, and 0001 for the outputs 829 to 832, respectively. Suppose the output value combination of the 2-to-4 decoder is 1000. Also suppose that the logic values applied to the two broadcast scan inputs 827 and 828 are V1 and V2, respectively. In this case, the values appearing at scan chain inputs 833 to 842 should be ~V1, V1, V1, V1, V1, V2, ~V2, V2, V2, V2, respectively. Here V1 and ~V1 are complementary, while V2 and ~V2 are complementary. This is the input constraint for ATPG. Obviously, by changing the values of virtual scan inputs 825 and 826, one can get different set of input constraints for ATPG. This will help in improving fault coverage.

Figure 9:
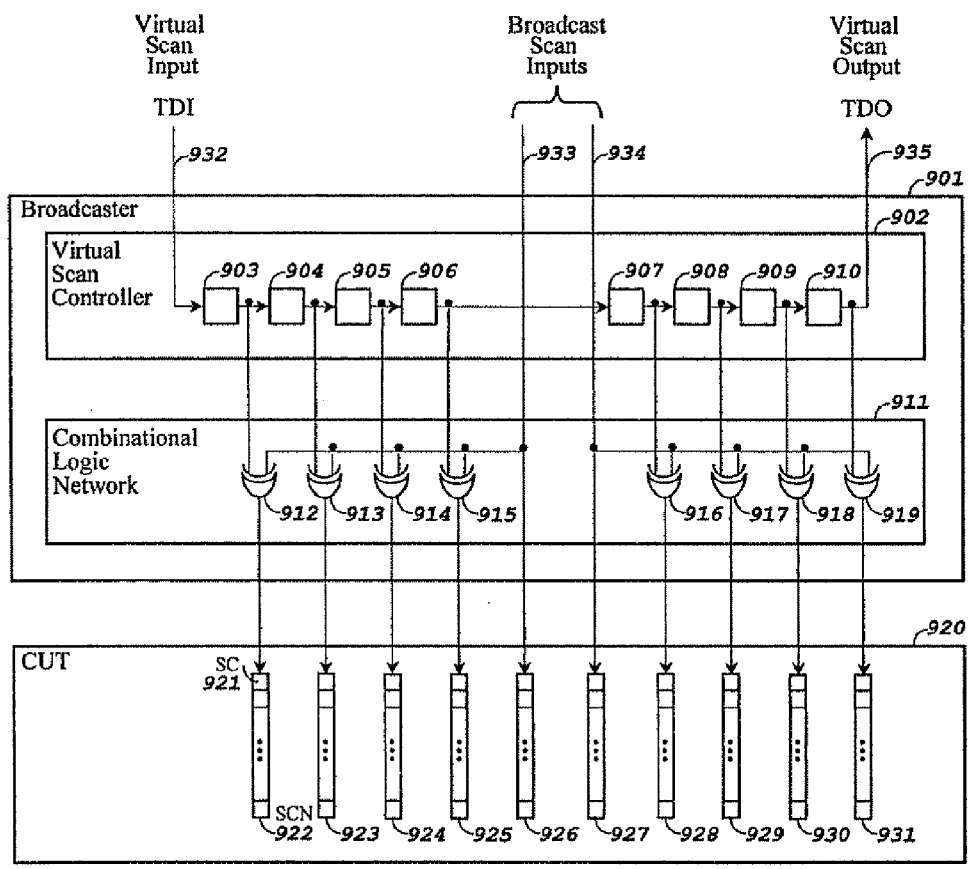
FIG. 9 shows a third embodiment of a broadcaster shown in FIG. 6, in accordance with the present invention.

FIG. 9 shows a third embodiment of a broadcaster shown in FIG. 6, in accordance with the present invention.

The broadcaster 901 consists of a virtual scan controller 902 and a combinational logic network 911. The virtual scan controller consists of an 8-stage shift register with memory elements 903 to 910. There is one virtual scan input 932, which is the input to the shift register. There is one optional virtual scan output 935, which is the output of the shift register. Optionally, the virtual scan input and the virtual scan output can be connected to TDI and TDO in the boundary scan design, respectively. The combinational logic network is composed of 8 XOR gates 912 to 919. There are two broadcast scan inputs, 933 and 934. Test patterns applied via the input 933 are broadcasted to scan chains 922 to 926; while test patterns applied via the input 934 are broadcasted to scan chains 927 to 931.

The scan chains 926 and 927 are loaded directly from the broadcast scan input 933 and 934, respectively, while the scan chains 922 to 925, as well as the scan chains 928 to 931, are loaded through XOR gates 912 to 915 and 916 to 919, respectively. If the value of the memory element 903 is a logic 0, the scan chain 922 will get the identical values as those applied from the broadcast scan input 933. If the value of the memory element 903 is a logic 1, the scan chain 922 will then get the complementary values to those applied from the broadcast scan input 933. The same observation applies to the scan chains 923 to 925 as well as 928 to 931. This means that, by applying a set of properly determined values to the shift register in the virtual scan controller 902, it is possible to apply any of the 1024 combinations of logic values to the scan chains 922 to 931 in any shift cycle. As a result, any detectable fault in the CUT 920 can be detected by loading a set of properly determined logic values to the shift register and by applying a broadcast scan pattern through the inputs 933 and 934.

From the point of view of ATPG, which tries to generate broadcast scan patterns to drive all scan chains in order to test the CUT 920, the broadcaster configuration determined by the values of the memory elements in the shift register of the virtual scan controller 902 represents an input constraint. Suppose that the values for the memory elements 903 to 910 are 0, 1, 0, 1, 0, 1, 0, 1, respectively. In this case, the ATPG for the CUT should satisfy such an input constraint that, in any shift cycle, the scan chains 922, 924, and 926 have the identical value V, the scan chains 923 and 925 have the identical value ~V that is the complement of V, the scan chains 927, 928, and 930 have the identical value P, the scan chains 929 and 931 have the identical value ~P that is the complement of P.

Figure 10:
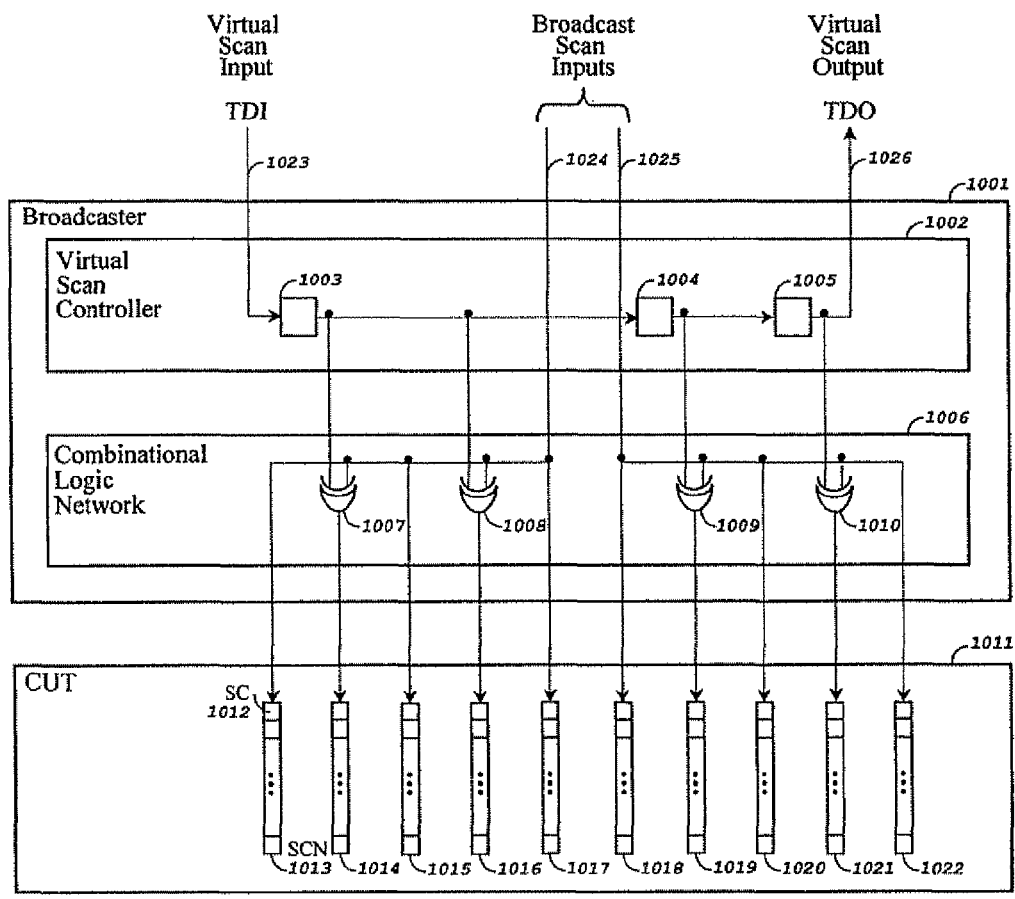
FIG. 10 shows a fourth embodiment of a broadcaster shown in FIG. 6, in accordance with the present invention.

FIG. 10 shows a fourth embodiment of a broadcaster shown in FIG. 6, in accordance with the present invention.

The broadcaster 1001 consists of a virtual scan controller 1002 and a combinational logic network 1006. The virtual scan controller consists of a 3-stage shift register with memory elements 1003 to 1005. There is one virtual scan input 1023, which is the input to the shift register. There is one optional virtual scan output 1026, which is the output of the shift register. Optionally, the virtual scan input and the virtual scan output can be connected to TDI and TDO in the boundary scan design, respectively. The combinational logic network is composed of 4 XOR gates 1007 to 1010. There are two broadcast scan inputs, 1024 and 1025. Test patterns applied via the input 1024 are broadcasted to scan chains 1013 to 1017; test patterns applied via the input 1025 are broadcasted to scan chains 1018 to 1022.

The major difference between the broadcaster 901 in FIG. 9 and the broadcaster 1001 in FIG. 10 is that test patterns are broadcasted directly to some scan chains instead of going through XOR gates in the broadcaster 1001. The scan chains 1013, 1015, and 1017 are driven directly from the broadcast scan input 1024. This means that, in any shift cycle, scan chains 1013, 1015, and 1017 will have the identical values. In addition, the scan chains 1018, 1020, and 1022 are driven directly from the broadcast scan input 1025. This means that, in any shift cycle, scan chains 1018, 1020, and 1022 will have the identical values. As a result, by applying a set of properly determined values to the shift register in the virtual scan controller 1002, it is only possible to apply any of the 64 combinations of logic values to the scan chains 1013 to 1022 in any shift cycle. That is, the broadcaster 1001 needs less hardware overhead at the expense of stronger constraints at the inputs to the scan chains.

Figure 11:
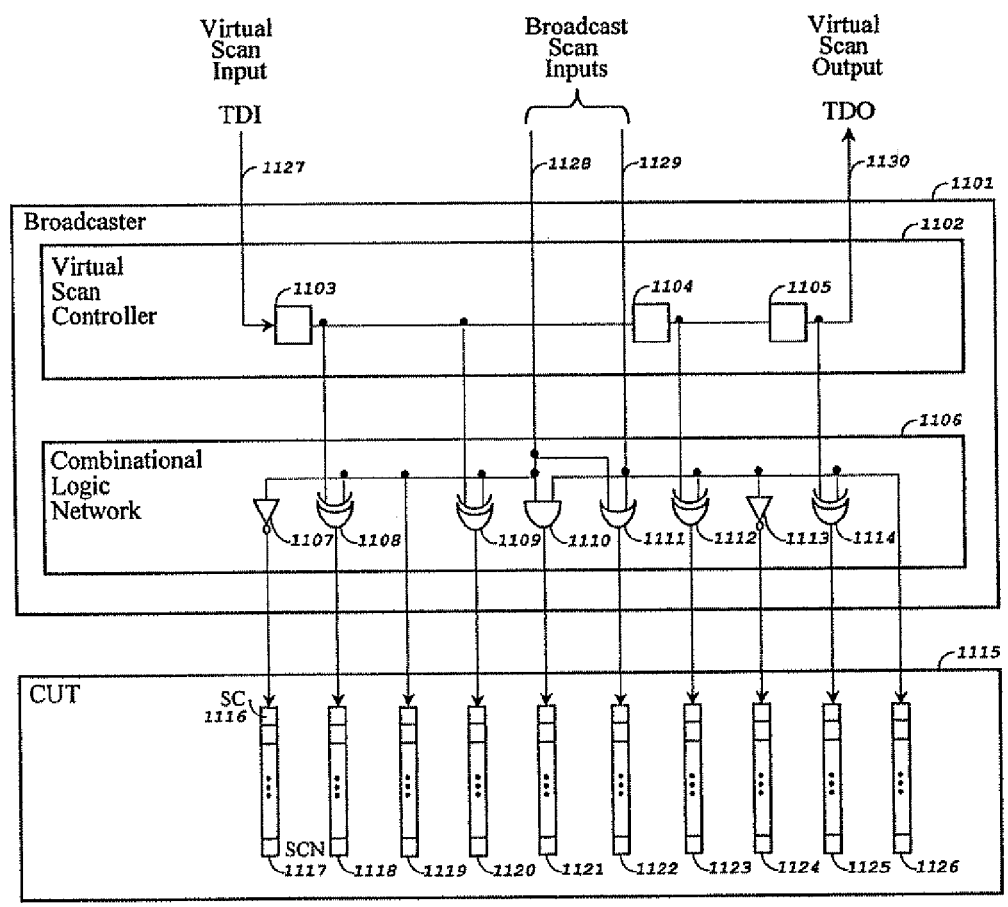
FIG. 11 shows a fifth embodiment of a broadcaster shown in FIG. 6, in accordance with the present invention.

FIG. 11 shows a fifth embodiment of a broadcaster shown in FIG. 6, in accordance with the present invention.

The broadcaster 1101 consists of a virtual scan controller 1102 and a combinational logic network 1106. The virtual scan controller consists of a 3-stage shift register with memory elements 1103 to 1105. There is one virtual scan input 1127, which is the input to the shift register. There is one optional virtual scan output 1130, which is the output of the shift register. Optionally, the virtual scan input and the virtual scan output can be connected to TDI and TDO in the boundary scan design, respectively. The combinational logic network is composed of four XOR gate (1108, 1109, 1112, 1114), two inverters (1107, 1113), one AND gate (1110), and one OR gate (1111). There are two broadcast scan inputs, 1128 and 1129. Test patterns applied via the input 1128 are broadcasted to scan chains 1117 to 1121; test patterns applied via the input 1129 are broadcasted to scan chains 1122 to 1126.

The broadcaster 1101 realizes more complex broadcast mapping relations from the broadcast scan inputs 1128 and 1129 to the inputs of the scan chains 1117 to 1126. The general form of the mapping relations can be represented by <VB, VC, V, VC, V*P, V+P, PC1, PB, PC2, P> corresponding to the inputs of the scan chains 1117 to 1126, respectively. Here, V and P are two logic values applied from the broadcast scan inputs 1128 and 1129 in any shift cycle, respectively. VB and PB are the complements of V and P, respectively. VC equals V or VB if the output value of the memory element 1103 is a logic 0 or 1, respectively. PC1 equals P or PB if the output value of the memory element 1104 is a logic 0 or 1, respectively; PC2 equals P or PB if the output value of the memory element 1105 is a logic 0 or 1, respectively. Obviously, the broadcast mapping relation can be changed by changing VC, PC1, and PC2 through loading different sets of logic values into the shift register in the virtual scan controller 1102. As a result, less inter-dependent test stimuli can be applied to the CUT 1115 so that higher fault coverage can be reached.

From the point of view of ATPG, which tries to generate broadcast scan patterns to drive all scan chains 1117 to 1126 in order to test the CUT 1115, the broadcaster configuration determined by the values of the memory elements in the shift register of the virtual scan controller 1102 represents an input constraint whose general form is <VB, VC, V, VC, V&P, V+P, PC1, PB, PC2, P>. This constrained ATPG can be performed if the original sequential CUT 1115 is transformed to a combinational circuit model reflecting the constraint after the values of the memory elements are determined.

Figure 12:
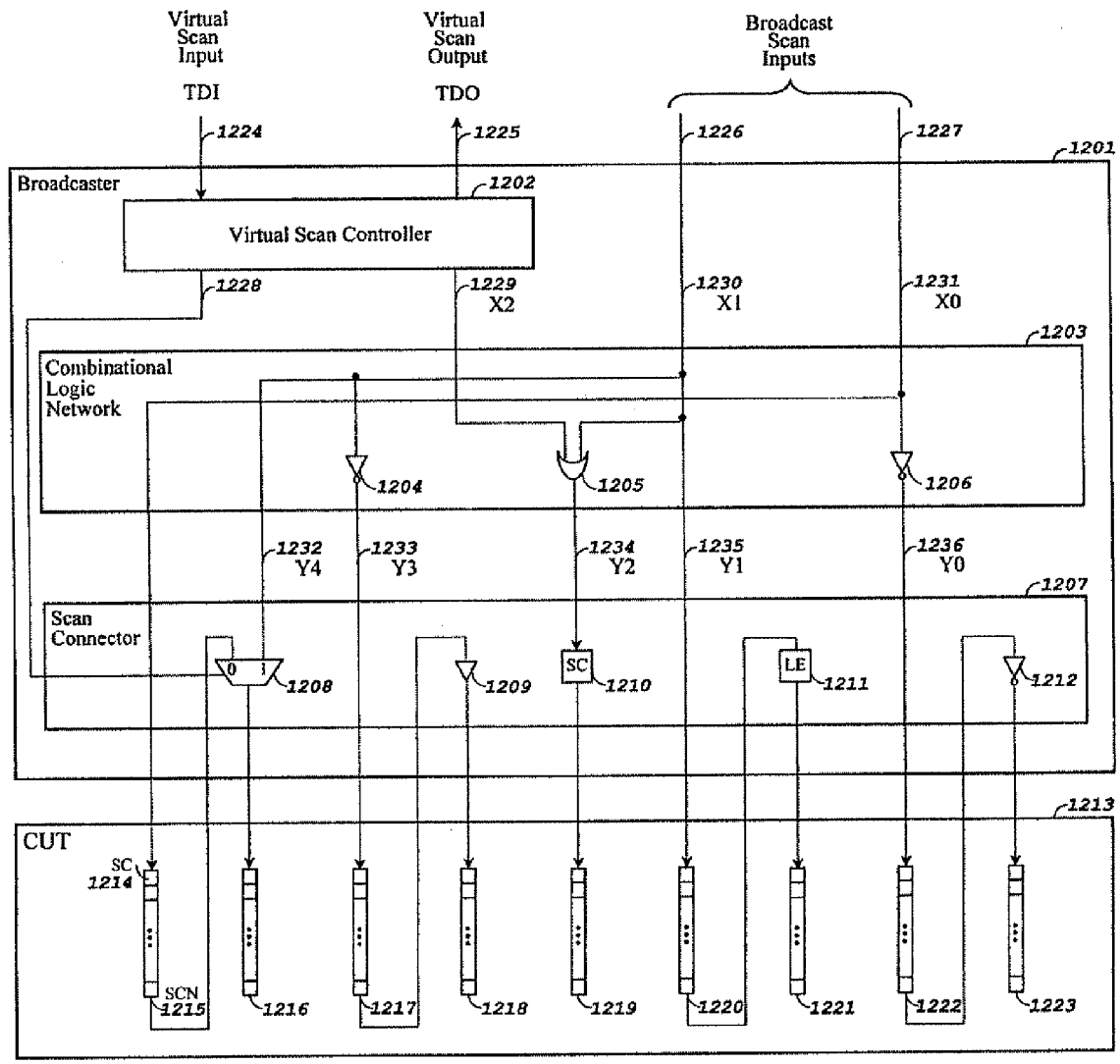
FIG. 12 shows a sixth embodiment of a broadcaster shown in FIG. 6, in accordance with the present invention.

FIG. 12 shows a sixth embodiment of a broadcaster shown in FIG. 6, in accordance with the present invention.

The broadcaster 1201 consists of a virtual scan controller 1202, a combinational logic network 1203, and a scan connector 1207. The combinational logic network contains two inverters 1204 and 1206 in addition to one OR gate 1205. Virtual scan patterns are applied via broadcast scan inputs 1226 and 1227 as well as a virtual scan input TDI 1224. One output X2 1229 from the virtual scan controller is applied to the combinational logic network, making it able to implement different mapping functions. The output values 1232 to 1236 from the combinational logic network is then applied to all scan chains 1215 to 1223 through the scan connector 1207. The scan connector consists of one buffer 1209, one inverter 1212, one lock-up element LE 1211, one spare cell SC 1210, and one multiplexer 1208. Generally, two scan chains can be connected into one by using a buffer, an inverter, or a lock-up element in a scan connector. In addition, a spare cell can be added into an existing scan chain to reduce the dependency among different scan chains. This will help improve fault coverage. Furthermore, a multiplexer can be used to split a scan chain into two parts. As shown in FIG. 12, if the selection signal 1228 of the multiplexer 1208 is a logic 1, the scan chains 1215 and 1216 will get different input value streams. However, if the selection signal 1228 of the multiplexer 1208 is a logic 0, the scan chains 1215 and 1216 can be seen as one scan chain, and only one input value stream goes though them. Obviously, a scan connector can be used to adjust the length of scan chains in the CUT in order to shorten test time or improve fault coverage.

Figure 13:
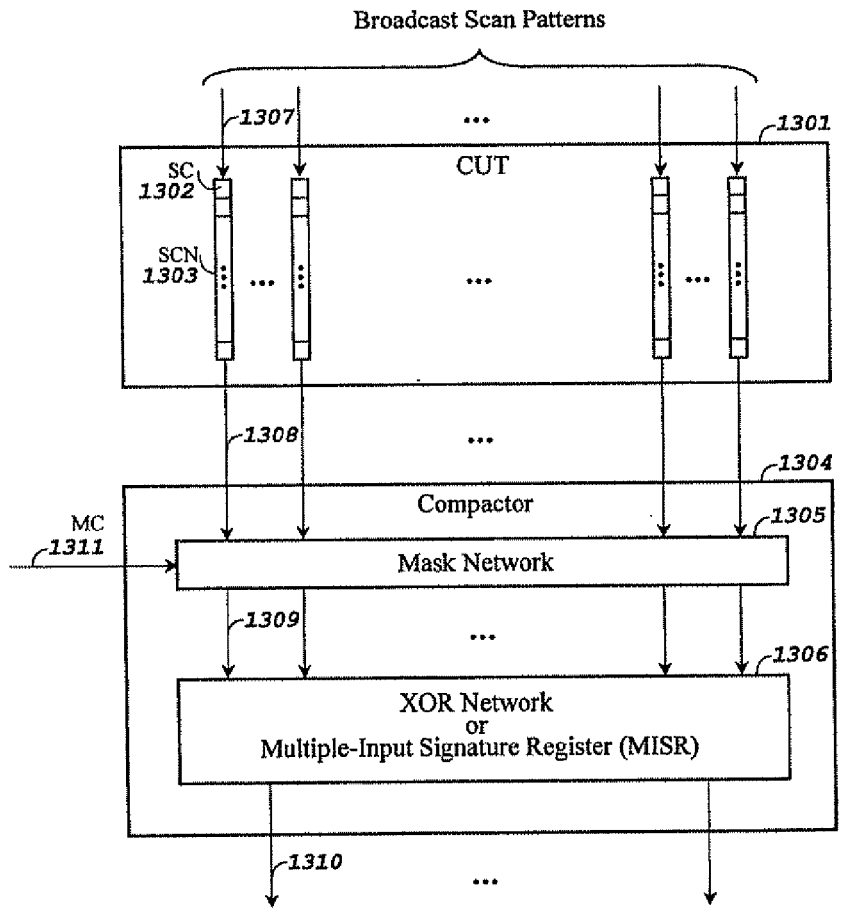
FIG. 13 shows a block diagram of a compactor, in accordance with the present invention, consisting of a mask network and a XOR network or a multiple-input signature register (MISR)

FIG. 13 shows a block diagram of a compactor, in accordance with the present invention, consisting of a mask network and a XOR network or a MISR.

The test responses on the outputs 1308 of the CUT corresponding to broadcast scan patterns applied on the inputs 1307 of the CUT pass through a compactor 1304, which consists of a mask network 1305 and a XOR network or a MISR 1306. MC 1311 is the signal used to control the mask network. It can be applied from an ATE or generated by a virtual scan controller. The mask network is used to mask some inputs to a XOR network or a MISR. This is useful in fault diagnosis. A XOR network is used to conduct space compaction, i.e. reducing the number of test response lines going out of the circuit. On the other hand, a MISR can be used to compress test responses in both space and time domains. That is, there is no need to check test results cycle by cycle when a MISR is used. On the contrary, it is only necessary to compare the signature obtained at the end of the whole test session. However, it should be noted that no unknown values (X's) are allowed to come into a MISR. This means stricter design rules should be followed.

Figure 14:
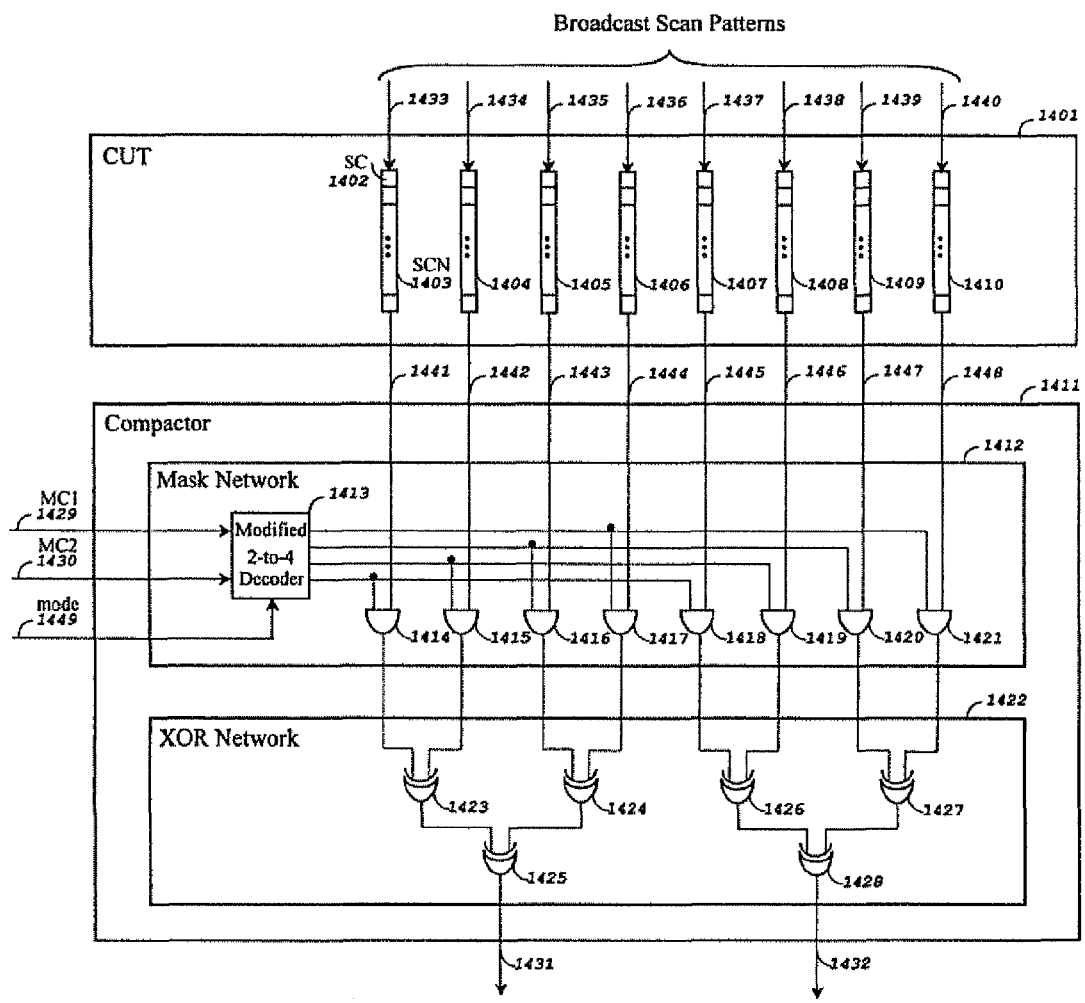
FIG. 14 shows a first embodiment of a compactor shown in FIG. 13, in accordance with the present invention.

FIG. 14 shows a first embodiment of a compactor shown in FIG. 13, in accordance with the present invention.

The test responses on the outputs 1441 to 1448 pass through a mask network 1412 and then a XOR network 1422. The mask network consists of two groups of AND gates 1414 to 1417 and 1418 to 1421, each group being controlled by the four outputs generated by a modified 2-to-4 decoder 1413. In the diagnosis mode where the mode signal 1449 is a logic 1, this decoder maps logic values on MC1 1429 and MC2 1430 to one of the following combinations: 1000, 0100, 0010, and 0001. With any of these logic combination, it is clear that either group of AND gates will allow only one test response stream to pass to 1431 or 1432. Obviously, this will help in fault diagnosis. In the test mode where the mode signal 1449 is a logic 0, this decoder will generate an all-1 logic combination. This will allow all test response streams pass to 1431 or 1432. The XOR network 1422 consists of two groups of 4-to-1 XOR sub-networks, composed of XOR gates 1423 to 1425 and 1426 to 1428, respectively.

Figure 15:
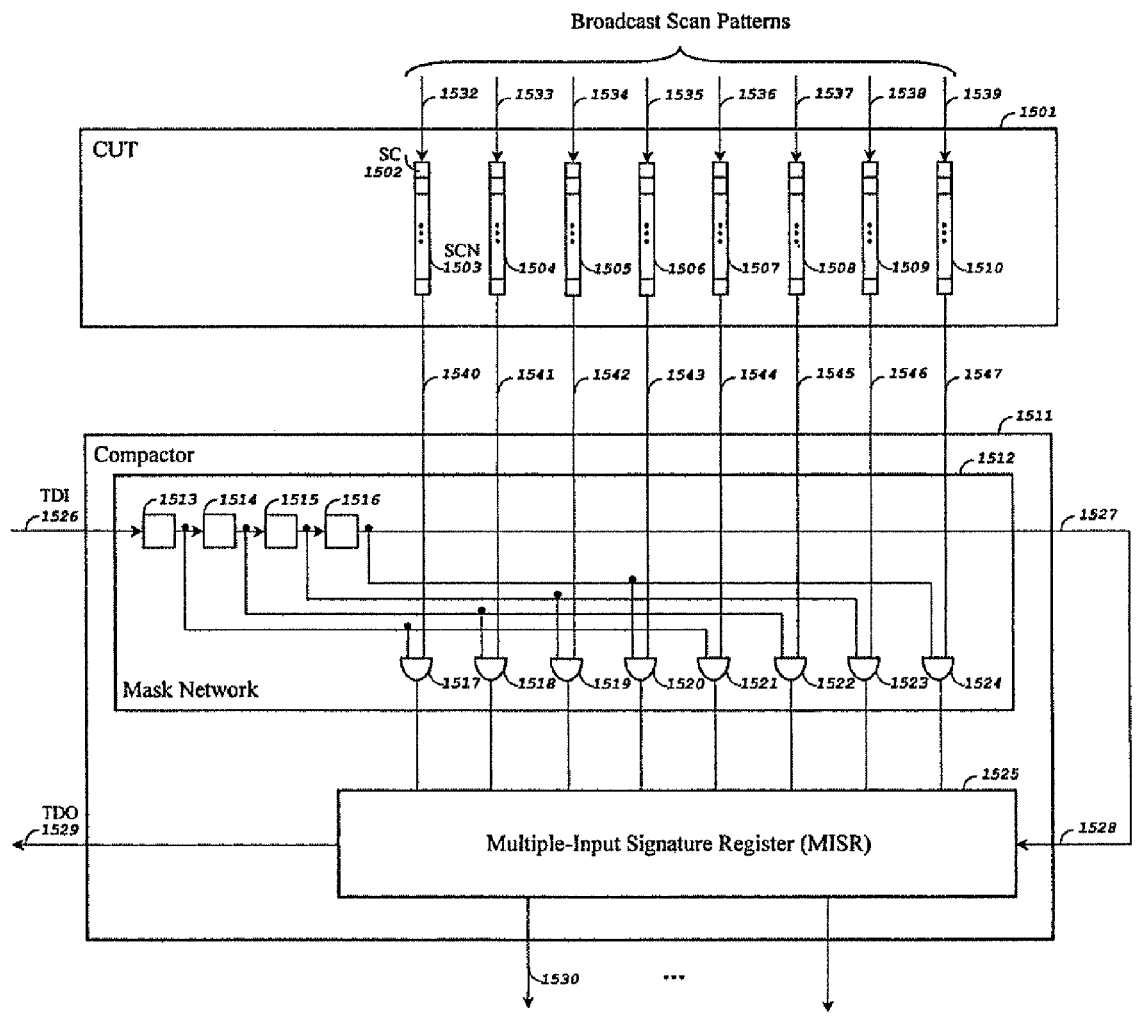
FIG. 15 shows a second embodiment of a compactor shown in FIG. 13, in accordance with the present invention.

FIG. 15 shows a second embodiment of a compactor shown in FIG. 13, in accordance with the present invention.

The test responses on the outputs 1540 to 1547 pass through a mask network 1512 and then a MISR 1525. The mask network consists of two groups of AND gates 1517 to 1520 and 1521 to 1524, each group being controlled by the four outputs of a shift register composed of memory elements 1513 to 1516. In the diagnosis mode, this shift register can be loaded from TDI 1526 with one of the following combinations: 1000, 0100, 0010, and 0001. With any of these logic combination, it is clear that either group of AND gates will allow only one test response to pass stream to the MISR. Obviously, this will help in fault diagnosis. In the test mode, an all-1 logic combination will be loaded into the shift register. This will allow all test response streams pass to the MISR. The content of the MISR at the end of a test session can be shifted out from TDO 1529 for comparison with the expected signature.

Figure 16A:
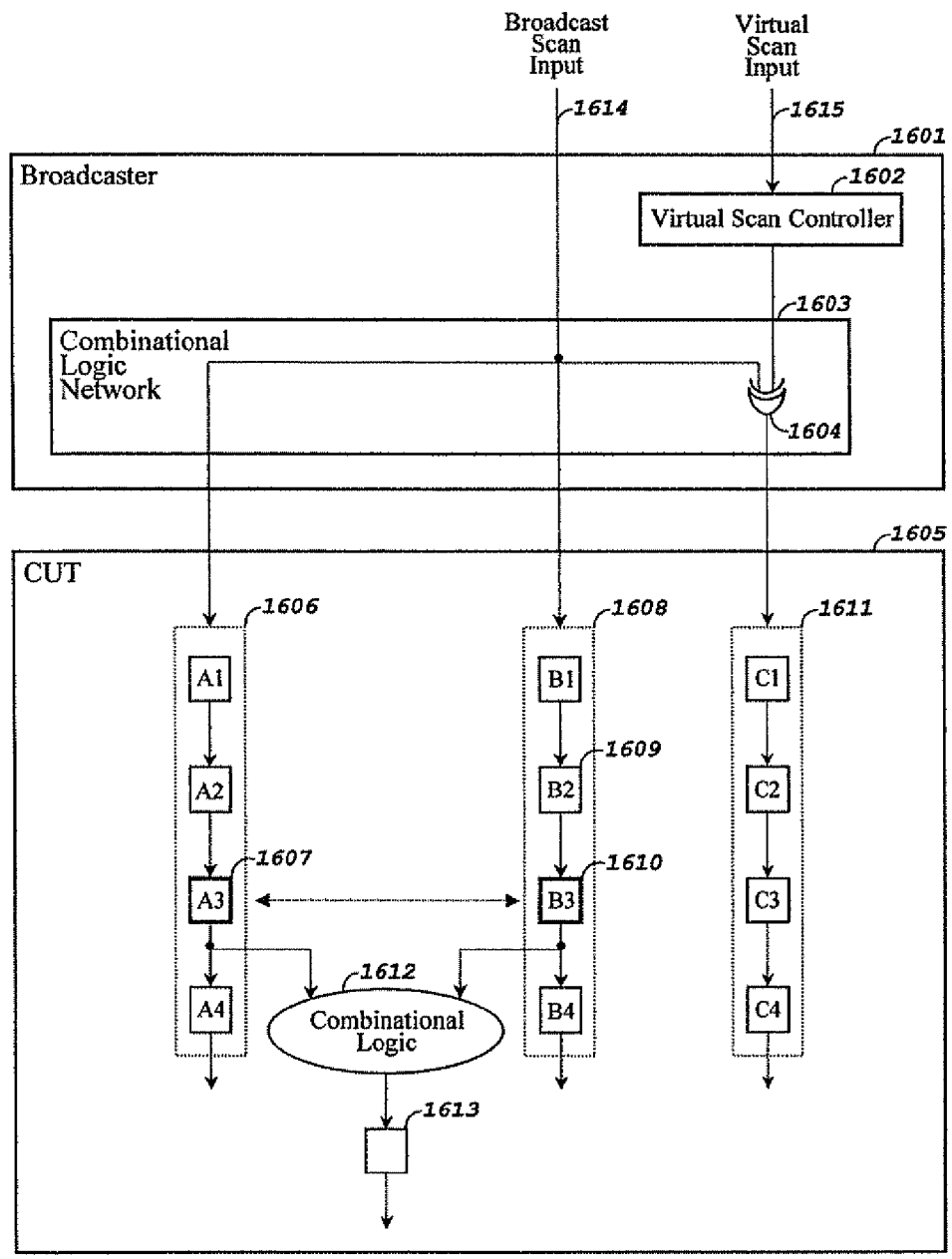
FIG. 16A shows an embodiment of the method before reordering scan cells or changing the scan chain length for generating broadcast scan patterns to test more faults, in accordance with the present invention.

FIG. 16A shows an embodiment of the method before reordering scan cells or changing the scan chain length for generating broadcast scan patterns to test more faults, in accordance with the present invention. A broadcaster 1601 has one broadcast scan input 1614, which broadcasts logic values to three scan chains, 1606, 1608, and 1611.

Since logic values are applied to the scan chain 1611 via an XOR gate 1604, by properly loading the shift register in the virtual scan controller 1602, it is possible, in any shift cycle, to apply any logic value which can be different from the one applied via scan chains 1606 and 1608. However, scan chains 1606 and 1608 will be loaded with the same logic values in any shift cycle. As a result, the scan cells A3 1607 and B3 1610 will have the same logic value in any broadcast test patterns. Since the outputs from the scan cells A3 1607 and B3 1610 are connected to the same combinational logic block 1612, it is possible that some faults in the combinational logic block cannot be detected due to this strong test pattern dependency. For example, in order to detect some faults in the combinational logic block, it may be necessary to have a logic 0 as the output of the scan cell A3 1607 and a logic 1 as the output of the scan cell B3 1610. Obviously, these faults will not be detected.

Figure 16B:
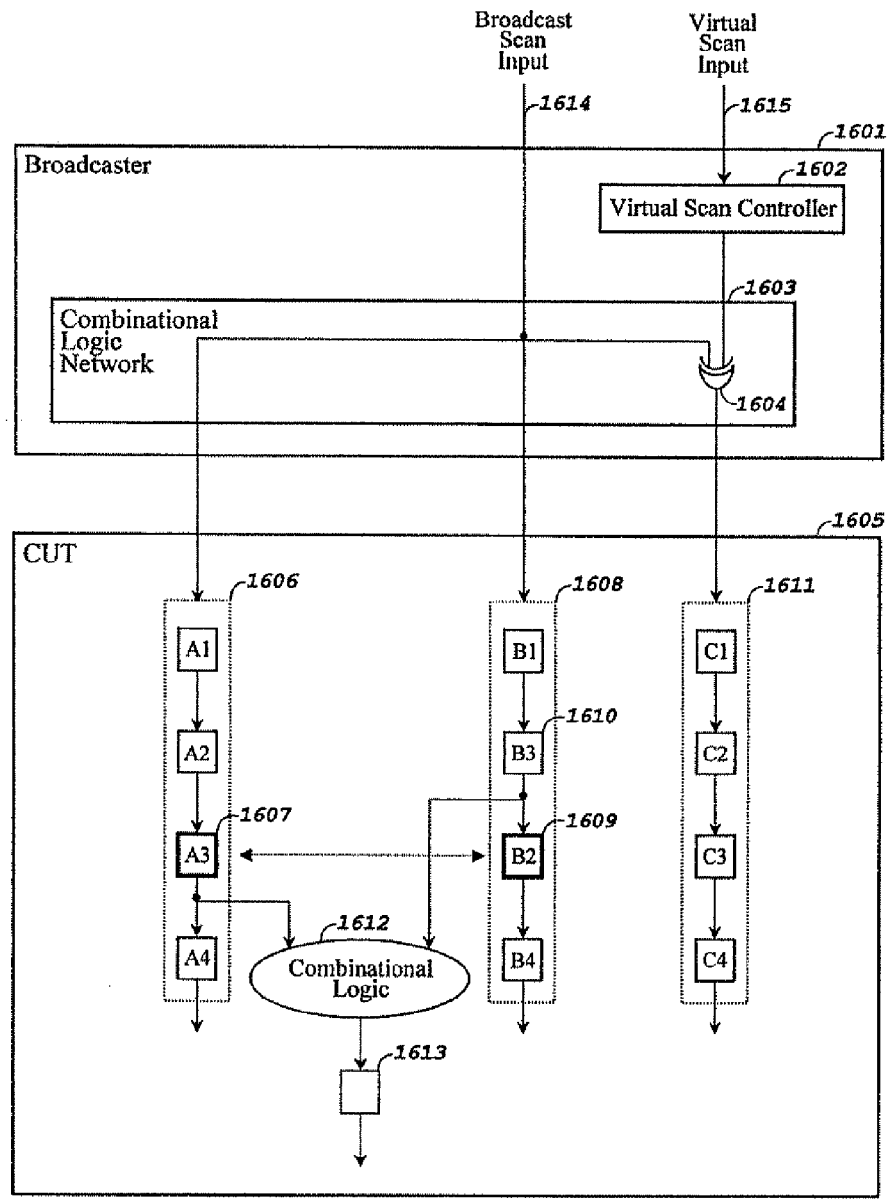
FIG. 16B shows an embodiment of the method after reordering scan cells for generating broadcast scan patterns to test more faults, in accordance with the present invention.

FIG. 16B shows an embodiment of the method after reordering scan cells for generating broadcast scan patterns to test more faults, in accordance with the present invention. A broadcaster 1601 has one broadcast scan input 1614, which broadcasts logic values to three scan chains, 1606, 1608, and 1611.

The only difference between FIG. 16A and FIG. 16B is that, in the scan chain 1608, the order of the scan cells B2 1609 and B3 1610 is changed. Now, although the outputs of the scan cells A3 1607 and B2 1609 have the same logic value in any shift cycle, the outputs of the scan cells A3 1607 and B3 1610 can have different logic values. As a result, this makes it possible to detect some faults that cannot be detected with the scan order shown in FIG. 16A.

Figure 16C:
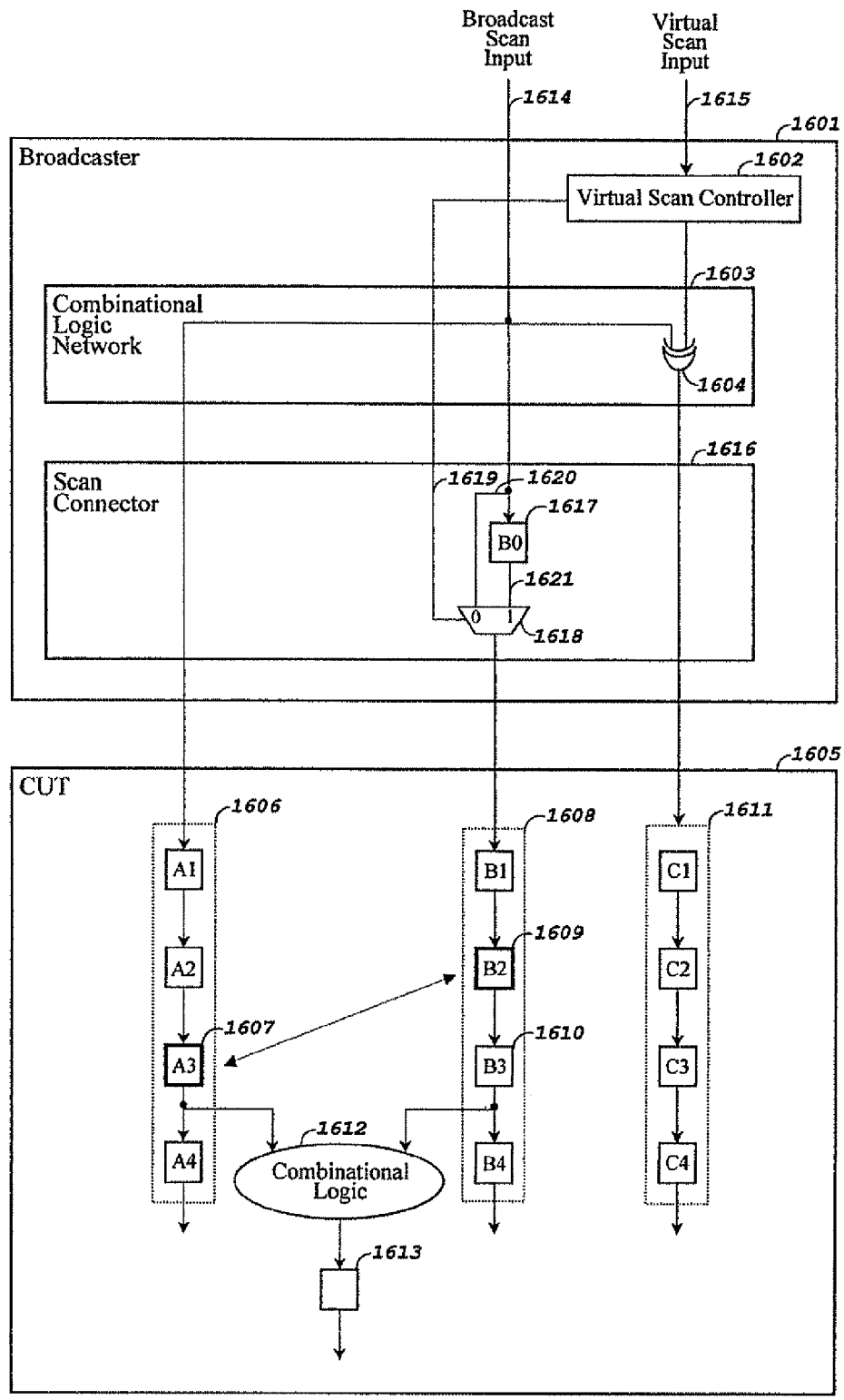
FIG. 16C shows an embodiment of the method after changing the scan chain length for generating broadcast scan patterns to test more faults, in accordance with the present invention.

FIG. 16C shows an embodiment of the method after changing the scan chain length for generating broadcast scan patterns to test more faults, in accordance with the present invention. A broadcaster 1601 has one broadcast scan input 1614, which broadcasts logic values to three scan chains, 1606, 1608, and 1611.

The only difference between FIG. 16A and FIG. 16C is that, one spare scan cell B0 1617 is added to the scan chain 1608 through a multiplexer 1618. It is clear that, if the selection signal 1619 is a logic 1, the spare scan cell will be added to the scan chain 1608. As a result, although the outputs of the scan cells A3 1607 and B2 1609 have the same logic value in any shift cycle, the outputs of the scan cells A3 1607 and B3 1610 can have different logic values. As a result, this makes it possible to detect some faults that cannot be detected with the scan order shown in FIG. 16A.

Figure 17:
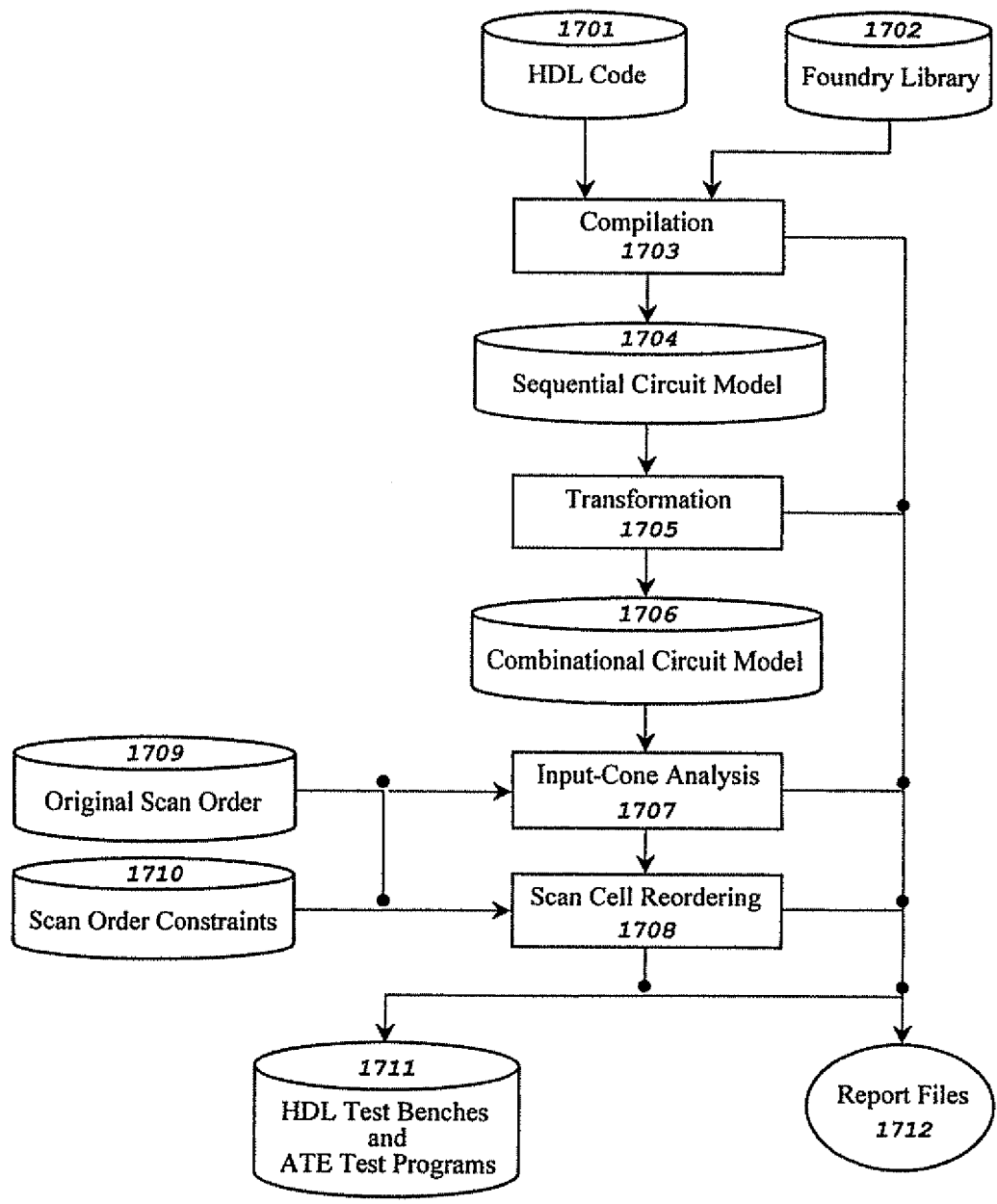
FIG. 17 shows a flow chart of the method for reordering scan cells for fault coverage improvement, in accordance with the present invention.

FIG. 17 shows a flow chart of the method for reordering scan cells for fault coverage improvement, in accordance with the present invention. This method 1700 accepts the user-supplied HDL codes 1701 together with the chosen foundry library 1702. The HDL codes represent a sequential circuit comprised of a broadcaster, a full-scan CUT, and a compactor as shown in FIG. 2. The HDL codes and the library are then complied into an internal sequential circuit model 1704, which is then transformed into a combination circuit model 1706. Then, based on the original scan order information 1709 and the scan order constraints 1710, the input-cone analysis 1707 is conducted to identify scan cells whose order needs to be changed. Then, scan chain reordering 1708 is conducted. After that, the HDL test benches and tester programs 1711 are generated while all reports and errors are saved in the report files 1712.

Figure 18:
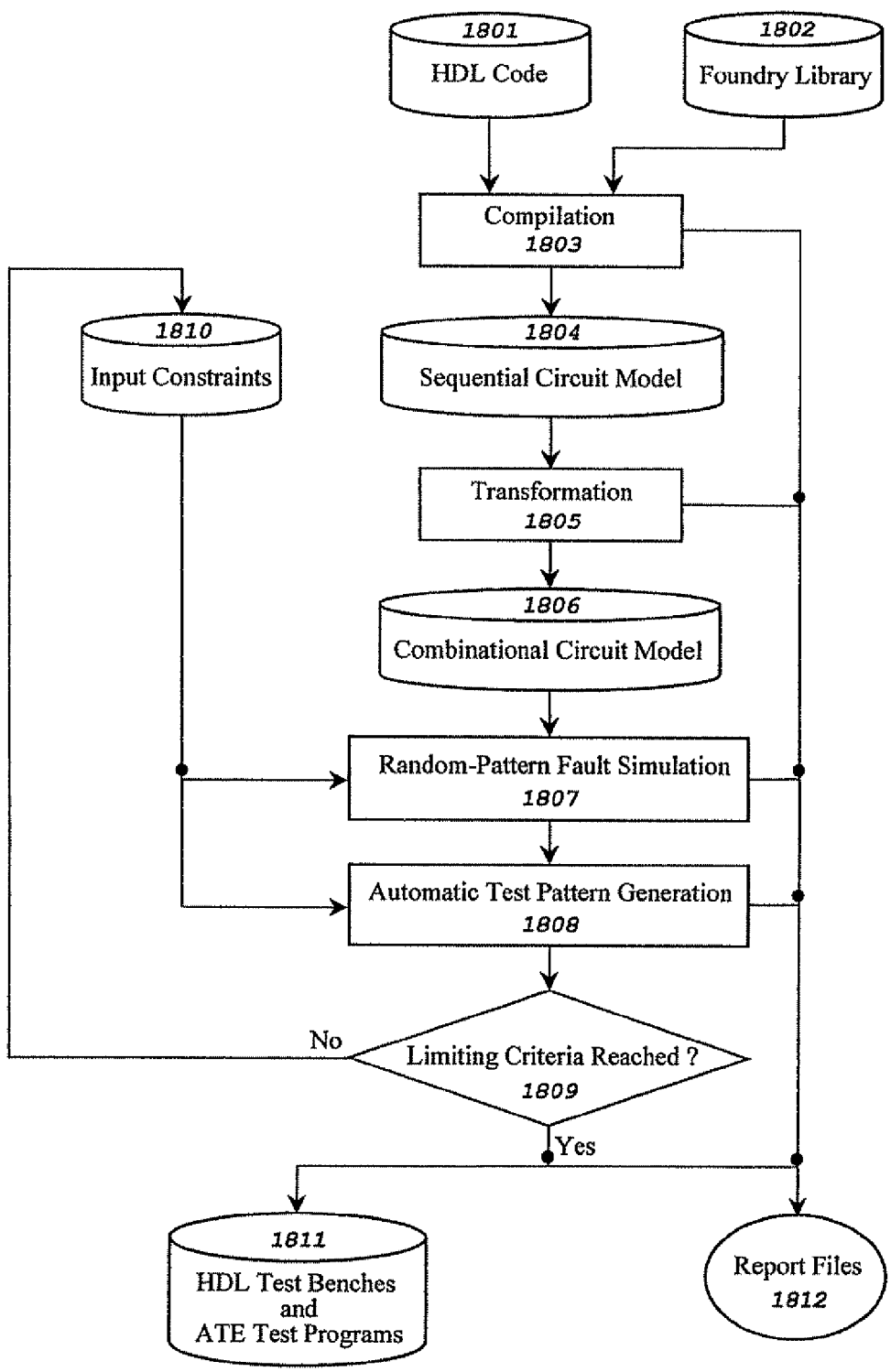
FIG. 18 shows a flow chart of the method for generating broadcast scan patterns used in testing scan-based integrated circuits, in accordance with the present invention.

FIG. 18 shows a flow chart of the method for generating broadcast scan patterns used in testing scan-based integrated circuits, in accordance with the present invention. This method 1800 accepts the user-supplied HDL codes 1801 together with the chosen foundry library 1802. The HDL codes represent a sequential circuit comprised of a broadcaster, a full-scan CUT, and a compactor as shown in FIG. 2. The HDL codes and the library are then complied into an internal sequential circuit model 1804, which is then transformed into a combination circuit model 1806. Then, based on input constraints 1810, combinational fault simulation 1807 is performed, if so required, for a number of random patterns and all detected faults are removed from the fault list. After that, combinational ATPG 1808 is performed to generate virtual scan patterns and all detected faults are removed from the fault list. If predetermined limiting criteria, such as a pre-selected fault coverage goal, are met, the HDL test benches and ATE test programs 1811 are generated while all reports and errors are saved in the report files 1812. If the predetermined limiting criteria are not met, new input constraints 1810 will be used. For example, a new set of values can be loaded into the virtual scan controller to specify new input constraints. After that, optional random-pattern fault simulation 1807 and ATPG 1808 are performed. This iteration goes on until the predetermined limiting criteria are met.

Figure 19:
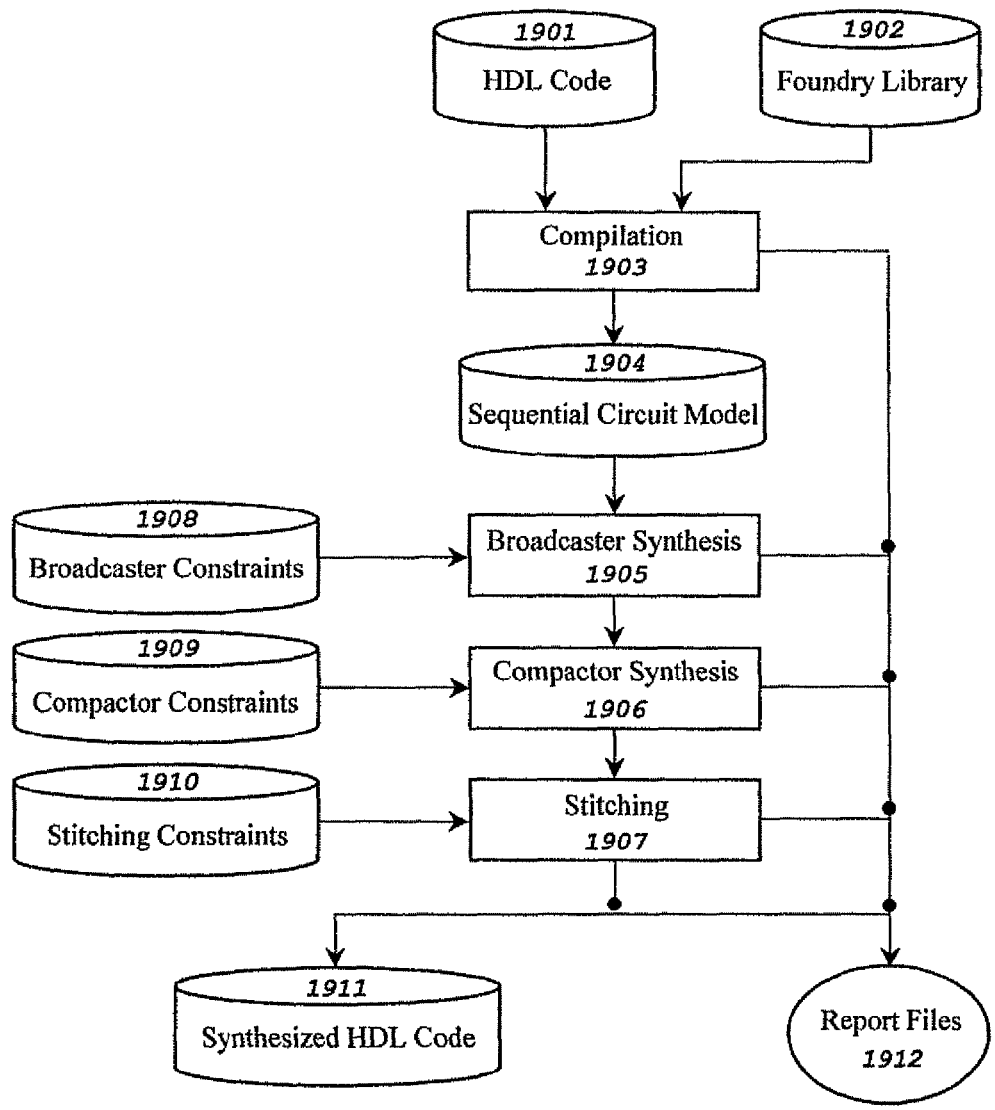
FIG. 19 shows a flow chart of the method for synthesizing a broadcaster and a compactor to test a scan-based integrated circuit, in accordance with the present invention.

FIG. 19 shows a flow chart of the method for synthesizing a broadcaster and a compactor to test a scan-based integrated circuit, in accordance with the present invention. This method 1900 accepts the user-supplied HDL codes 1901 together with the chosen foundry library 1902. The HDL codes represent a sequential circuit comprised of a broadcaster, a full-scan CUT, and a compactor as shown in FIG. 2. The HDL codes and the library are then complied into an internal sequential circuit model 1904. Then, based on the broadcaster constraints 1908 and the compacter constraints 1909, broadcaster synthesis 1905 and compactor synthesis 1906 are conducted, respectively. After that, based on the stitching constraints 1910, stitching 1907 is conducted to integrate the broadcaster and the compactor to the original circuit. At the end, the synthesized HDL codes 1911 are generated while all reports and errors are saved in the report files 1912.

Figure 20:
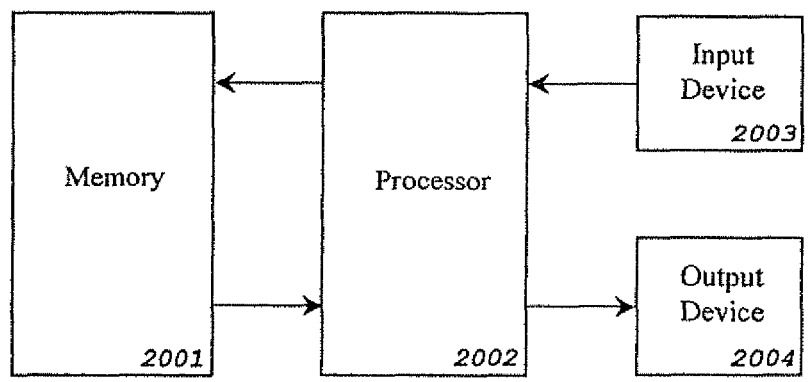
FIG. 20 shows an example system in which the broadcast scan test method, in accordance with the present invention, may be implemented.

FIG. 20 shows an example system in which the broadcast scan test method, in accordance with the present invention, may be implemented. The system 2000 includes a processor 2002, which operates together with a memory 2001 to run a set of the broadcast scan test design software. The processor 2002 may represent a central processing unit of a personal computer, workstation, mainframe computer or other suitable digital processing device. The memory 2001 can be an electronic memory or a magnetic or optical disk-based memory, or various combinations thereof. A designer interacts with the broadcast scan test design software run by processor 2002 to provide appropriate inputs via an input device 2003, which may be a keyboard, disk drive or other suitable source of design information. The processor 2002 provides outputs to the designer via an output device 2004, which may be a display, a printer, a disk drive or various combinations of these and other elements.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

We claim:

1. A broadcaster that accepts a virtual scan pattern for generating a broadcast scan pattern to test a scan-based integrated circuit, the scan-based integrated circuit containing multiple scan chains, each scan chain comprising multiple scan cells coupled in series, said broadcaster comprising:
- a) a virtual scan controller for controlling the operation of said broadcaster during each shift cycle or between test sessions, said virtual scan controller further including one or more shift registers for accepting said virtual scan pattern via one or more scan inputs of said broadcaster; and
- b) a solely combinational logic network directly connected to one or more selected outputs of said virtual scan controller for generating said broadcast scan pattern at outputs of said combinational logic network in said broadcaster, said combinational logic network further comprising one or more logic gates, said logic gates further comprising an AND gate, an OR gate, a NAND gate, a NOR gate, a multiplexer, a buffer, or an inverter, and wherein application of said virtual scan pattern to said scan-based integrated circuit through said broadcaster decreases a test application time relative to a test application time for a test that does not utilize said broadcaster.

2. The broadcaster of claim 1, further comprising a first scan connector to merge two selected scan chains into one long scan chain, wherein said first scan connector further comprises at least a buffer, an inverter, a multiplexer, or a lockup element.

3. The broadcaster of claim 1, further comprising a second scan connector inserted into a selected scan chain to reduce or eliminate the inter-dependency of said selected scan chain on other selected scan chains, wherein said second scan connector further comprises one or more spare scan cells.

4. The broadcaster of claim 1, further comprising a third scan connector inserted into the outputs of said combinational logic network and selected scan cells within said scan chains to selectively reorder the scan cells within each selected scan chain or split a selected scan chain to two or more short scan chains; wherein said third scan connector further comprises one or more multiplexers.

5. The broadcaster of claim 1, wherein each said shift register further comprises one or more memory elements, wherein each said memory element further includes a flip-flop or a latch.

6. The broadcaster of claim 1, further comprising a clock for controlling said virtual scan controller, wherein said clock runs at a frequency equal to a shift clock controlling said scan cells in a said scan chain.

7. The broadcaster of claim 1, further comprising a clock for controlling said virtual scan controller, wherein said clock runs at a frequency higher than a shift clock controlling said scan cells in a said scan chain.

8. The broadcaster of claim 1, further comprising circuitry adapted to transmit said virtual scan patterns to said scan inputs of said broadcaster and transmitting said broadcast scan patterns generated by said broadcaster to selected scan data inputs of said scan chains in said scan-based integrated circuit.

9. The broadcaster of claim 1, wherein said broadcaster is selectively placed inside or external to said scan-based integrated circuit.

10. The broadcaster of claim 1, wherein said one or more scan inputs include one or more virtual scan inputs.

11. The broadcaster of claim 1, wherein said one or more scan inputs include one or more virtual scan inputs and one or more broadcast scan inputs.

12. A method that accepts a virtual scan pattern stored in an automatic test equipment (ATE) for generating a broadcast scan pattern to test a scan-based integrated circuit, the scan-based integrated circuit containing multiple scan chains, each scan chain comprising multiple scan cells coupled in series, the scan chains coupled to a broadcaster, said method comprising:
- a) transmitting said virtual scan pattern stored in said ATE to said broadcaster for generating said broadcast scan pattern by using a virtual scan controller and a solely combinational logic network to test manufacturing faults in said scan-based integrated circuit; and
- b) comparing a test response of said scan-based integrated circuit with an expected test response; wherein said virtual scan controller further includes one or more shift registers for accepting said virtual scan pattern via one or more scan inputs of said broadcaster, and wherein said combinational logic network is further directly connected to one or more selected outputs of said virtual scan controller for generating said broadcast scan pattern at outputs of said combinational logic network in said broadcaster and further comprises one or more logic gates, said logic gate further including an AND gate, an OR gate, a NAND gate, a NOR gate, a multiplexer, a buffer, or an inverter, and wherein application of said virtual scan pattern to said scan-based integrated circuit through said broadcaster decreases a test application time relative to a test application time for a test that does not utilize said broadcaster.

13. The method of claim 12, further comprising using a scan connector to merge two selected scan chains into one long scan chain, wherein said scan connector further comprises at least a buffer, an inverter, a multiplexer, or a lockup element.

14. The method of claim 12, wherein each said shift register further comprises one or more memory elements, wherein each said memory element further includes a flip-flop or a latch.

15. The method of claim 12, further comprising a clock for controlling said virtual scan controller, wherein said clock runs at a frequency equal to a shift clock controlling said scan cells in a said scan chain.

16. The method of claim 12, further comprising a clock for controlling said virtual scan controller, wherein said clock runs at a frequency higher than a shift clock controlling said scan cells in a said scan chain.

17. The method of claim 12, further comprising transmitting said virtual scan pattern to said one or more scan inputs of said broadcaster and transmitting said broadcast scan pattern generated by said broadcaster to selected scan data inputs of said scan chains in said scan-based integrated circuit.

18. The method of claim 12, wherein said one or more scan inputs include one or more virtual scan inputs and one or more broadcast scan inputs.

19. The method of claim 12, wherein said one or more scan inputs include one or more virtual scan inputs.

20. The method of claim 12, wherein said one or more scan inputs include broadcast scan inputs.

21. The method of claim 12, wherein said combinational logic network is further connected to one or more selected scan inputs of said broadcaster.

* * * * *